(12) United States Patent
Lu et al.

(10) Patent No.: US 11,322,622 B2
(45) Date of Patent: May 3, 2022

(54) OXIDE-BASED FLEXIBLE HIGH VOLTAGE THIN FILM TRANSISTOR

(71) Applicant: Rutgers, The State University of New Jersey, New Brunswick, NJ (US)

(72) Inventors: Yicheng Lu, Piscataway, NJ (US); Wen-Chiang Hong, Piscataway, NJ (US); Xiaolong Du, Beijing (CN); Yonghui Zhang, Beijing (CN); Zengxia Mei, Beijing (CN)

(73) Assignee: Rutgers, The State University of New Jersey, New Brunswick, NJ (US)

( * ) Notice: Subject to any disclaimer, the term of this patent is extended or adjusted under 35 U.S.C. 154(b) by 0 days.

(21) Appl. No.: 16/981,464

(22) PCT Filed: Mar. 19, 2019

(86) PCT No.: PCT/US2019/022872
§ 371 (c)(1),
(2) Date: Sep. 16, 2020

(87) PCT Pub. No.: WO2019/183030
PCT Pub. Date: Sep. 26, 2019

(65) Prior Publication Data
US 2021/0005753 A1   Jan. 7, 2021

Related U.S. Application Data

(60) Provisional application No. 62/644,818, filed on Mar. 19, 2018.

(51) Int. Cl.
*H01L 29/786* (2006.01)
*H01L 29/72* (2006.01)
(Continued)

(52) U.S. Cl.
CPC ...... *H01L 29/7869* (2013.01); *H01L 27/0629* (2013.01); *H01L 29/22* (2013.01);
(Continued)

(58) Field of Classification Search
CPC ................. H01L 29/7869; H01L 29/22; H01L 29/41733; H01L 29/513; H01L 29/517;
(Continued)

(56) References Cited

U.S. PATENT DOCUMENTS

2010/0059753 A1 * 3/2010 Andrews ........... H01L 29/78603
257/59
2011/0108909 A1   5/2011 Weng et al.
(Continued)

FOREIGN PATENT DOCUMENTS

| CN | 1719620 A | 1/2006 |
|----|-----------|--------|
| WO | 2018/035502 A1 | 2/2018 |

(Continued)

OTHER PUBLICATIONS

International Search Report and Written Opinion for International Application No. PCT/US2019/022872 titled: "Oxide-Based Flexible High Voltage Thin Film Transistor," dated Jun. 5, 2019.
(Continued)

*Primary Examiner* — Tong-Ho Kim
(74) *Attorney, Agent, or Firm* — Hamilton, Brook, Smith & Reynolds, P.C.

(57) ABSTRACT

Embodiments are directed to a flexible high voltage thin film transistor (f-HVTFT) with a center-symmetric circular configuration. The f-HVTFT includes a ring-shaped oxide semiconductor channel, a ring-shaped gate, a ring-shaped source, and a circular drain. The source and gate each have multiple connections to respective electrode pads, enabling stable and identical electrical characteristics and blocking voltage while the f-HVTFT is subject to bending from random
(Continued)

directions. The f-HVTFT enables a high blocking voltage over 100 V, on-current over 100 µA, and low off-current of 0.1 pA, which makes it suitable for power management of self-powered wearable electronic systems.

21 Claims, 17 Drawing Sheets

(51) Int. Cl.

| | | |
|---|---|---|
| *H01L 29/51* | (2006.01) | |
| *H01L 29/739* | (2006.01) | |
| *H01L 27/06* | (2006.01) | |
| *H01L 29/417* | (2006.01) | |
| *H01L 29/22* | (2006.01) | |
| *H02M 3/155* | (2006.01) | |

(52) U.S. Cl.
CPC ...... *H01L 29/41733* (2013.01); *H01L 29/513* (2013.01); *H01L 29/517* (2013.01); *H01L 29/7391* (2013.01); *H01L 29/78603* (2013.01); *H01L 29/78696* (2013.01); *H02M 3/155* (2013.01)

(58) Field of Classification Search
CPC .......... H01L 29/7391; H01L 29/78603; H01L 29/78696; H01L 27/0629; H02M 3/155
USPC .......................................................... 257/43
See application file for complete search history.

(56) References Cited

U.S. PATENT DOCUMENTS

| | | | |
|---|---|---|---|
| 2013/0207101 A1 | 8/2013 | Yamazaki et al. | |
| 2014/0138646 A1* | 5/2014 | Lee | H01L 23/544 257/40 |
| 2014/0239294 A1* | 8/2014 | Yamazaki | H01L 29/78696 257/43 |
| 2014/0239299 A1* | 8/2014 | Yamazaki | H01L 29/04 257/43 |
| 2015/0372146 A1* | 12/2015 | Shishido | H01L 29/41733 257/43 |

FOREIGN PATENT DOCUMENTS

| | | | | |
|---|---|---|---|---|
| WO | WO-2018035502 A1 * | 2/2018 | ......... | H01L 29/7869 |
| WO | 2019183030 A1 | 9/2019 | | |

OTHER PUBLICATIONS

Hong, et al., "MgZnO High Voltage Thin Film Transistors on Glass for Inverters in Building Integrated Photovoltaics," Scientific Reports, Published Oct. 10, 2016.
Zhang, et al., "Review of flexible and transparent thin-film transistors based on zinc oxide and related materials," Chin. Phys. B., vol. 26, No. 4 (2017).
Mativenga, et al., "Circular Structure for High Mechanical Bending Stability of a-IGZO TFTs," Journal of the Electron Devices Society, vol. 5, No. 6, Sep. 2017.
Fan, et al., "Transparent Triboelectric Nanogenerators and Self-Powered Pressure Sensors Based on Micropatterned Plastic Films," Nano Letters (2012).
Seung, et al., "Nanopatterned Textile-Based Wearable Triboelectric Nanogenerator," ACS Nano, vol. 9, No. 4, 3501-3509, 2015.
Smith, et al., "High-Voltage Organic Thin-Film Transistors on Flexible and Curved Surfaces," IEEE Transactions on Electron Devices, vol. 62, No. 12, Dec. 2015.
Dagdeviren, et al., "Transient, Biocompatible Electronics and Energy Harvesters Based on ZnO," Small 2013.
Kwon, et al., "Piezoelectric Effect on the Electronic Transport Characteristics of ZnO Nanowire Field-Effect Transistors on Bent Flexible Substrates," Advanced Materials, 2008, 20, 4557-4562.
He, et al., "Piezoelectric Gated Diode of a Single ZnO Nanowire," Advanced Materials, 2007, 19, 781-784.
Jeong, et al., "Semiconductor-Insulator-Semiconductor Diode Consisting of Monolayer MoS2, h-BN, and GaN Heterostructure" ACS Nano 2015, vol. 9, No. 10, 10032-10038.
Marette, et al., "Flexible Zinc-Tin Oxide Thin Film Transistors Operating at 1 kV for Integrated Switching of Dielectric Elastomer Actuators Arrays," Adv. Mater. 2017, 29, 1700880. https://doi.org/10.1002/adma.201700880.
Ha, et al., "Triboelectric Generators and Sensors for Self-Powered Wearable Electronics," ACS Nano 2015, vol. 9, No. 4, 3421-3427.
Fan, et al., "Flexible Nanogenerators for Energy Harvesting and Self-Powered Electronics," Advanced Materials, vol. 28, 2016.
Brotherton, S. D., "Introduction to thin film transistors: Physics and Technology of TFTs," (Springer International Publishing, 2013).
Miyasaka et al., "Technical Obstacles to Thin Film Transistor Circuits on Plastic," Jpn. J. Appl. Phys., vol. 47, No. 6 (2008).
Kuo, et al., "Reliability of a-Si:H TFTs and Copper Interconnect Lines for Flexible Electronics," 2008 ECS—The Electrochemical Society, ECS Transactions, vol. 16, No. 9 (2008).
Notification Concerning Transmittal of International Preliminary Report on Patentability and International Preliminary Report on Patentability, PCT/US2019/022872, entitled, "Oxide-Based Flexible High Voltage Thin Film Transistor,", dated Oct. 1, 2020.

* cited by examiner

111

MATERIAL LISTS

| SOURCE/DRAIN: Ti/Au, OR GZO, AZO FOR THE TRANSPARENT ELECTRODE | — 112 |

| DIELECTRIC LAYER: HIGH-K DIELECTRIC MATERIAL LIKE $Al_2O_3$, $HfO_x$, ETC | — 113 |

| CHANNEL: ZnO, OR $Mg_xZn_{1-x}O$ (0.01< x < 0.06), I.E. MZO | — 114 |

| GATE: Cr OR GZO FOR TRANSPARENT ELECTRODE | — 115 |

FIG.1D

CASE 1: CONVENTIONAL TFT NO OFFSET REGION

CASE 2: TFT WITH G-D OFFSET REGION

CASE 3: TFT WITH BOTH G-D AND G-S OFFSET REGION

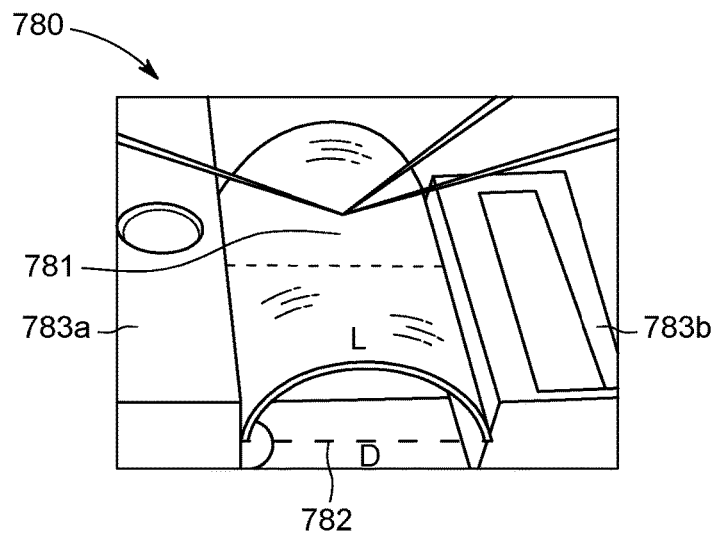
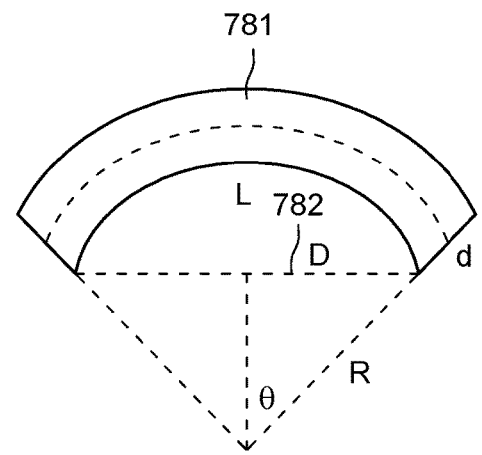
FIG. 6A
FIG. 6B
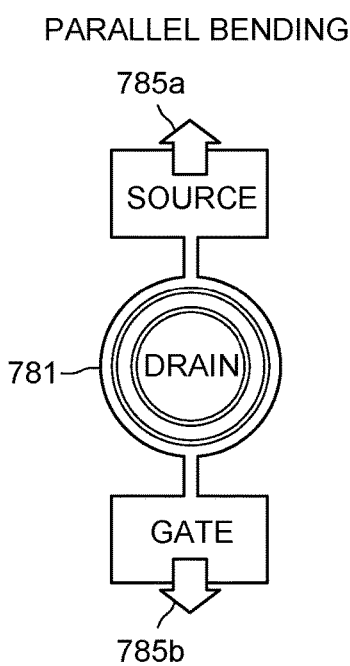
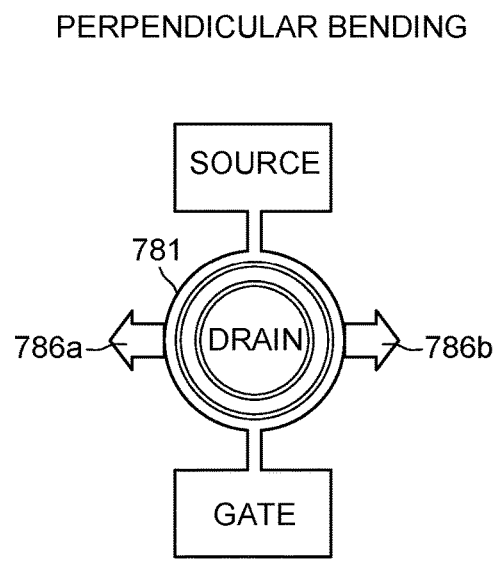
FIG. 6C
FIG. 6D

CIRCUIT CONFIGURATION

BOTTOM GATE CONFIGURATION

OXIDE-BASED FLEXIBLE HIGH VOLTAGE THIN FILM TRANSISTOR

RELATED APPLICATIONS

This application is the U.S. National Stage of International Application No. PCT/US2019/022872, filed Mar. 19, 2019, which designates the U.S., published in English, and claims the benefit of U.S. Provisional Application No. 62/644,818, filed on Mar. 19, 2018. The entire teachings of the above applications are incorporated herein by reference.

BACKGROUND

Recently, the "Internet of Things" (IoT) has been one of the most popular research topics in both academia and industry. IoT addresses the network of physical objects which can be controlled and interacted with wirelessly through the support of current computer technologies, such as: Bluetooth, Wi-Fi, smart phones, and cloud computing. IoT technologies aim to improve user experiences and efficiency, and seek to reduce power consumption across a variety of applications, such as medical monitoring and food supply. In IoT technologies, the sub-field of wearable systems has attracted increasing research interest due to its many applications and wearable systems' ability to provide a profound impact on people's daily lives. Wearable systems have been emerging for broad applications and have significant market potential. However, one of the major technical challenges for wearable technology is power management. Moreover, a physical connection, such as wired charging and wired communication should be minimized in wearable technology. As a result, wearable devices with long battery life and life span are preferred.

Traditionally, wearable electronics systems are powered by lithium-ion batteries or other external power sources. However, these power sources are less than ideal because lithium-ion batteries have a significant environmental impact and external power sources rely on wiring that degrades the user experience with wearable devices. These issues have stimulated efforts to develop self-powered portable wearable electronics that can be utilized in building a sustainable wearable system. Many of these efforts focus on developing high efficiency wearable power generators. The power management systems for these wearable technologies play a key role in the self-powered system. Thus, high voltage devices, i.e., transistors, are fundamental components in the power control circuits for the power management components of self-powered wearable systems.

SUMMARY

Wearable electronics have broad applications, such as personal health and wellness and have a profound impact on people's daily lives. Wearable electronics rely on power and three major energy sources have been investigated for possible nano-generators (power generators) for wearable electronics: (i) biomechanical energy from the movement of the wearable device user, (ii) solar energy, and (iii) thermal energy from the temperature difference between the wearable device user, e.g., human, and surrounding environment. However, the conventional power controller that these nano-generators rely on is bulky and undesirable for use with wearable electronics. The existing power controllers are also built on rigid substrates, separated from the nano-generators and also require additional wiring to connect to the nano-generators. For wearable systems, it is desired to integrate nano-generators with the power control device on a single flexible substrate, such as a plastic or fabric/textile substrates. Such an integrated self-powered wearable system is small in size, flexible, eliminates the need for external wiring between nano-generators and the power controller, and enables recharging of flexible batteries and the direct driving of electronics under vastly different environmental conditions.

To develop a flexible power management component for wearable electronics, a high voltage transistor fabricated on a flexible substrate at a low process temperature is needed. Embodiments of the present invention provide such a flexible high voltage thin film transistor (f-HVTFT) that can be utilized in the power management component of self-powered wearable systems. Embodiments can be integrated with wearable power generators to charge wearable batteries or directly drive other wearable electronic devices, such as sensors, actuators, and communication platforms.

One such embodiment of the present invention is directed to a f-HVTFT having a bottom gate configuration. In such an embodiment, the f-HVTFT comprises a flexible substrate with a ring-shaped gate on the flexible substrate and an insulating gate dielectric layer on the gate and the flexible substrate. Such an embodiment of the f-HVTFT also includes a ring-shaped semiconductor channel on the insulating gate dielectric layer and a ring-shaped source and a circular drain, wherein the source, the drain, and the gate are concentric and the source and the drain are over the insulating gate dielectric layer with the ring-shaped semiconductor channel between said source and drain, and where, there is an offset region between the circular drain and the ring-shaped gate. Such an embodiment also includes a source electrode pad with multiple connections to the ring-shaped source and a gate electrode pad with multiple connections to the ring-shaped gate. Another embodiment of the f-HVTFT has two offset regions, one between the drain and gate and another between the gate and source.

According to an embodiment, the flexible substrate of the f-HVTFT is transparent and thus, the f-HVTFT is also transparent. In another embodiment, the flexible substrate is opaque and thus, in such an embodiment, the flexible and bendable f-HVTFT is not totally transparent. In an example embodiment, the flexible substrate is composed of at least one of: polyimide, plastics, polyethylene naphthalate (PEN), textiles, paper, metal and bendable glass.

In yet another embodiment of the f-HVTFT, a given electrode pad, i.e., the source electrode pad and/or gate electrode pad, has multiple connections, equally distributed in perpendicular directions, to its respective transistor component terminals, e.g. the source or the gate.

Embodiments of the f-HVTFT and elements thereof may be composed of a variety of materials. In an embodiment, the channel of the f-HVTFT is composed of at least one oxide semiconductor. According to such an embodiment, the oxide semiconductor channel may be composed of at least one of: Zinc Oxide (ZnO), pure ZnO, doped ZnO, ZnO based semiconductor heterostructures, and ZnO alloys. In yet another embodiment, the oxide semiconductor channel is composed of Magnesium Zinc Oxide ($Mg_xZn_{1-x}O$) where $0<x<0.06$. This channel composition, according to an embodiment, enhances the thermal stability, negative bias stress (NBS) stability, and threshold voltage stability of the f-HVTFT's operation.

In yet another embodiment, the insulating gate dielectric layer is composed of at least one of: Silicon Dioxide ($SiO_2$), Aluminum Oxide ($Al_2O_3$), Hafnium Oxide ($HfO_2$), and Magnesium Oxide (MgO). In an alternative embodiment, the insulating gate dielectric layer is a multi-layer dielectric stacking structure composed of at least one of: $SiO_2$, $Al_2O_3$, $HfO_2$, and $MgO$. In an embodiment, the effective thickness of the multi-layer dielectric stacking structure is configured to allow the f-HVTFT to satisfy requirements of both (i) high blocking voltage and (ii) sufficient on-current. For example, in an embodiment the multi-layer dielectric stacking structure has an effective thickness between 50 nm and 300 nm. In yet another embodiment, the insulating gate dielectric layer of the f-HVTFT has a thickness between 50 nm and 300 nm.

Embodiments of the f-HVTFT are fabricated at temperatures that are compatible with the materials that comprise the device. For instance, in an embodiment, the process for fabricating the f-HVTFT is performed at temperatures compatible with the flexible substrate comprising at least one of: polyimide, plastics, PEN, textiles, paper, and bendable glass. This manufacturing technique ensures the integrity of the f-HVTFT.

In an embodiment, the ring shaped gate, ring shaped source, and circular drain of the f-HVTFT are center-symmetric. This symmetry is advantageous because it prevents electric field crowding and also enhances the strength of the f-HVTFT against bending along random directions.

As described herein, embodiments can be incorporated into the power management components of self-powered wearable electronic systems. In one such implementation, the f-HVTFT provides the sufficient on-current (~10 µA) and the high blocking voltage (~100V) to match the output characteristics of the energy sources, e.g., triboelectric nano-generators and wearable solar cells, amongst others, of wearable devices. According to an embodiment, the f-HVTFT has a small leakage current which enables low standby power consumption that is important to self-powered wearable systems.

Embodiments of the f-HVTFT described herein having a bottom gate configuration can be employed in a variety of applications. For instance, an embodiment of the f-HVTFT can be used in an inverter of a microelectromechanical system (MEMS). Likewise, in another embodiment, the f-HVTFT is used in an inverter to drive an actuator. Further still, embodiments of the f-HVTFT may be used in a flexible power management system employed in a mobile phone and/or a flexible display. Yet another embodiment of the f-HVTFT is used in a three-dimensional vertically integrated circuit. In such an embodiment, employing the f-HVTFT in the vertically integrated circuit reduces the overall size of the circuit. Another embodiment of the present invention is directed to a self-powered wearable system that includes a power management component that includes a f-HVTFT as described herein. Similarly, yet another embodiment is directed to a portable and wearable system that includes a f-HVTFT to provide blocking voltage and on-current matching output characteristics of a nano-generator coupled to the wearable system.

Another embodiment of the present invention is directed to a flexible diode (f-diode) that is achieved by connecting the gate and drain of the f-HVTFTs described, through the metallization process during the fabrication. Such reconfiguration and reconnection can be done in embodiments of the bottom gate f-HVTFT and top gate f-HVTFT described herein. In one such embodiment, the f-diode includes a flexible substrate, a ring-shaped gate on the flexible substrate, and an insulating gate dielectric layer on the gate and the flexible substrate. Such a flexible diode also includes a ring-shaped oxide semiconductor channel on the insulating gate dielectric layer, a circular source, and a ring-shaped drain, wherein the source, the drain, and the gate are concentric and the source and the drain are over the insulating gate dielectric layer with the ring-shaped oxide semiconductor channel between said source and drain, and where, there is an offset region between the circular source and the ring-shaped gate and a terminal of the ring-shaped drain is connected to a terminal of the ring-shaped gate. Such a flexible diode embodiment also includes a drain electrode pad with multiple connections to the ring-shaped drain and a gate electrode pad with multiple connections to the ring-shaped gate.

An embodiment of the invention is directed to a transformerless DC/DC converter implemented as a power management component of a self-powered wearable system. The DC/DC converter includes a f-HVTFT with a bottom gate configuration and a flexible diode. The f-HVTFT in the DC/DC converter includes a flexible substrate, a ring-shaped gate on the flexible substrate, an insulating gate dielectric layer on the gate and the flexible substrate, a ring-shaped oxide semiconductor channel on the insulating gate dielectric layer, a ring-shaped source, and a circular drain, wherein the source, the drain, and the gate are concentric and the source and the drain are over the insulating gate dielectric layer with the ring-shaped oxide semiconductor channel between said source and drain, and where, there is an offset region between the circular drain and the ring-shaped gate. Moreover, the f-HVTFT includes a source electrode pad having multiple connections to the ring-shaped source and a gate electrode pad having multiple connections to the ring-shaped gate. The flexible diode in the DC/DC converter comprises a given flexible substrate, a given ring-shaped gate on the given flexible substrate, a given insulating gate dielectric layer on the given gate and the given flexible substrate, a given ring-shaped oxide semiconductor channel on the given insulating gate dielectric layer, a given circular source and a given ring-shaped drain, wherein the given source, the given drain, and the given gate are concentric and the given source and the given drain are over the given insulating gate dielectric layer with the given ring-shaped oxide semiconductor channel between said given source and given drain, and where, there is a given offset region between the given circular source and the given ring-shaped gate and a terminal of the given ring-shaped drain is connected to a terminal of the given ring-shaped gate. Further, the flexible diode in the DC/DC converter comprises a given drain electrode pad having multiple connections to the given ring-shaped drain and a given gate electrode pad having multiple connections to the given ring-shaped gate. According to an embodiment of the DC/DC converter, the flexible diode of the DC/DC converter separates input and output of the DC/DC converter.

Yet another embodiment of the present invention is directed to a DC/AC inverter implemented as a power management component of a self-powered wearable system. Such a DC/AC inverter embodiment includes a plurality of f-HVTFTs and a plurality of flexible diodes. Each f-HVTFT includes a flexible substrate, a ring-shaped gate on the flexible substrate, an insulating gate dielectric layer on the gate and the flexible substrate, a ring-shaped oxide semiconductor channel on the insulating gate dielectric layer, a ring-shaped source, and a circular drain, wherein the source, the drain, and the gate are concentric and the source and the drain are over the insulating gate dielectric layer with the ring-shaped oxide semiconductor channel between said source and drain, and where, there is an offset region between the circular drain and the ring-shaped gate. Further, each f-HVTFT includes a source electrode pad having multiple connections to the ring-shaped source and a gate electrode pad having multiple connections to the ring-shaped gate. Each flexible diode of the plurality of flexible diodes includes a given flexible substrate, a given ring-shaped gate on the given flexible substrate, a given insulating gate dielectric layer on the given gate and the given flexible substrate, a given ring-shaped oxide semiconductor channel on the given insulating gate dielectric layer, a given circular source, and a given ring-shaped drain, wherein the given source, the given drain, and the given gate are concentric and the given source and the given drain are over the given insulating gate dielectric layer with the given ring-shaped oxide semiconductor channel between said given source and given drain, and where, there is a given offset region between the given circular source and the given ring-shaped gate and a terminal of the given ring-shaped drain is connected to a terminal of the given ring-shaped gate. Each flexible diode also includes a given drain electrode pad having multiple connections to the given ring-shaped drain and a given gate electrode pad having multiple connections to the given ring-shaped gate. In such a DC/AC inverter embodiment, the inverter is formed through connecting respective pairings each comprising a given flexible diode of the plurality of flexible diodes and a given f-HVTFT of the plurality of f-HVTFTs. According to an embodiment, in each respective pairing, the given flexible diode and the given f-HVTFT are connected in parallel.

Another embodiment of the present invention is directed to a center-symmetric f-HVTFT having a top gate configuration. In embodiments, the top gate f-HVTFT may have the same operating principle as embodiments of the bottom-gated f-HVTFT. Moreover, embodiments of the top gate f-HVTFT may be achieved by changing the order of the layers of the bottom-gated f-HVTFT counterpart and the corresponding process steps. Furthermore, embodiments of the top gate f-HVTFT may be employed in the same applications as embodiments of the bottom gate f-HVTFT described herein.

According to an embodiment, a f-HVTFT having a top gate configuration includes a flexible substrate, an insulating layer on the flexible substrate, and a ring-shaped semiconductor channel on the insulating layer. The f-HVTFT with a top gate configuration also includes a ring-shaped source and a circular drain, wherein the source and the drain are concentric and the source and the drain are over the insulating layer and in contact with the ring-shaped semiconductor channel, an insulating gate dielectric layer on the ring-shaped oxide semiconductor channel, a ring-shaped gate on the insulating gate dielectric layer, wherein there is an offset region between the ring-shaped gate and the circular drain and where, the gate, the source, and the drain are concentric, and also includes a source electrode pad with multiple connections to the ring-shaped source and a gate electrode pad having with connections to the ring-shaped gate.

According to an embodiment, the flexible substrate of the f-HVTFT having a top gate configuration is transparent and thus, the f-HVTFT is also transparent. In another embodiment, the flexible substrate is opaque. In an embodiment of the f-HVTFT having a top gate configuration, the flexible substrate is composed of at least one of: polyimide, plastics, PEN, textiles, paper, and bendable glass.

In yet another embodiment, a given electrode pad, i.e., the source electrode pad and/or gate electrode pad, has multiple connections, equally distributed in perpendicular directions, to its respective component, e.g. the source or the gate.

Embodiments of the f-HVTFT with the top gate configuration and elements thereof may be composed of a variety of materials. In an embodiment, the channel is composed of at least one oxide semiconductor. According to such an embodiment, the oxide semiconductor channel may be composed of at least one of: ZnO, pure ZnO, doped ZnO, ZnO based semiconductor heterostructures, and ZnO alloys. In yet another embodiment, the oxide semiconductor channel is composed of $Mg_xZn_{1-x}O$ where $0<x<0.06$.

In yet another embodiment, the insulating gate dielectric layer is composed of at least one of: $SiO_2$, $Al_2O_3$, $HfO_2$, and MgO. In an alternative embodiment, the insulating gate dielectric layer is a multi-layer dielectric stacking structure composed of at least one of: $SiO_2$, $Al_2O_3$, $HfO_2$, and MgO. In an embodiment of the f-HVTFT having a top gate configuration, the multi-layer dielectric stacking structure has an effective thickness between 50 nm and 300 nm. In yet another embodiment, the insulating gate dielectric layer has a thickness between 50 nm and 300 nm.

Embodiments of the f-HVTFT with a top gate configuration are fabricated at temperatures that are compatible with the materials that comprise the device. For instance, in an embodiment, the f-HVTFT is fabricated at temperatures compatible with the flexible substrate comprising at least one of: polyimide, plastics, PEN, textiles, paper, metal and bendable glass.

Embodiments of the f-HVTFT described herein having a top gate configuration can be employed in a variety of applications. For instance, an embodiment of the f-HVTFT can be used in an inverter of a MEMS device. Likewise, in another embodiment, the f-HVTFT is used in an inverter of an actuator. Further still, embodiments of the top gate f-HVTFT may be used in a flexible power management system employed in a mobile phone and/or a flexible display. Yet another embodiment of the f-HVTFT having a top-gate configuration is used in a three-dimensional vertically integrated circuit. An embodiment of the present invention is directed to a self-powered wearable system that includes a power management component that includes a f-HVTFT with a top gate configuration as described herein. Similarly, yet another embodiment is directed to a portable and wearable system that includes a f-HVTFT with a top gate configuration to provide blocking voltage and on-current matching output characteristics of a nano-generator coupled to the wearable system.

An alternative embodiment of the present invention is directed to a flexible diode that comprises a flexible substrate, an insulating layer on the flexible substrate, a ring-shaped oxide semiconductor channel on the insulating layer, a ring-shaped source and a circular drain, wherein the source and the drain are concentric and the source and the drain are over the insulating layer and in contact with the ring-shaped oxide semiconductor channel, an insulating gate dielectric layer on the ring-shaped oxide semiconductor channel, a ring-shaped gate on the insulating gate dielectric layer, wherein there is an offset region between the ring-shaped gate and the ring-shaped source and where, the gate, the source, and the drain are concentric and a terminal of the gate is connected to a terminal of the drain, and a source electrode pad with multiple connections to the ring-shaped source and a gate electrode pad with multiple connections to the ring-shaped gate.

Another embodiment of the present invention is directed to a transformer-less DC/DC converter implemented in a power management component of a self-powered wearable system. An embodiment of the DC/DC converter includes a f-HVTFT with a top gate configuration and a flexible diode.

In such an embodiment of the DC/DC converter, the f-HVTFT comprises a flexible substrate, an insulating layer on the flexible substrate, a ring-shaped oxide semiconductor channel on the insulating layer, a ring-shaped source and a circular drain, wherein the source and the drain are concentric and the source and the drain are over the insulating layer and in contact with the ring-shaped oxide semiconductor channel. The f-HVTFT in such an embodiment also includes an insulating gate dielectric layer on the ring-shaped oxide semiconductor channel, a ring-shaped gate on the insulating gate dielectric layer, where there is an offset region between the ring-shaped gate and the circular drain and where, the gate, the source, and the drain are concentric, and a source electrode pad with multiple connections to the ring-shaped source and a gate electrode pad with multiple connections to the ring-shaped gate. Further, the flexible diode of the DC/DC converter comprises a given flexible substrate, a given insulating layer on the given flexible substrate, a given ring-shaped oxide semiconductor channel on the given insulating layer, a given ring-shaped source and a given circular drain, wherein the given source and the given drain are concentric and the given source and the given drain are over the given insulating layer and in contact with the given ring-shaped oxide semiconductor channel, a given insulating gate dielectric layer on the given ring-shaped oxide semiconductor channel, a given ring-shaped gate on the given insulating gate dielectric layer, where there is a given offset region between the given ring-shaped gate and the given ring-shaped source and where, the given gate, the given source, and the given drain are concentric and a terminal of the given gate is connected to a terminal of the given drain. The flexible diode in such an embodiment also includes a given source electrode pad with multiple connections to the given ring-shaped source and a given gate electrode pad with multiple connections to the given ring-shaped gate. According to an embodiment of the DC/DC converter, the flexible diode separates input and output of the DC/DC converter.

Yet another embodiment is directed to a DC/AC inverter implemented in a power management component of a self-powered wearable system. The DC/AC inverter includes a plurality of f-HVTFTs with a top gate configuration and a plurality of flexible diodes where the inverter is formed through connecting respective pairings each comprising a given flexible diode of the plurality of flexible diodes and a given f-HVTFT of the plurality of f-HVTFTs. In such an embodiment, each f-HVTFT of the plurality comprises a flexible substrate, an insulating layer on the flexible substrate, a ring-shaped oxide semiconductor channel on the insulating layer, a ring-shaped source and a circular drain, where the source and the drain are concentric and the source and the drain are over the insulating layer and in contact with the ring-shaped oxide semiconductor channel. Each f-HVTFT also includes an insulating gate dielectric layer on the ring-shaped oxide semiconductor channel, a ring-shaped gate on the insulating gate dielectric layer, wherein there is an offset region between the ring-shaped gate and the circular drain and where, the gate, the source, and the drain are concentric, and, further, a source electrode pad with multiple connections to the ring-shaped source and a gate electrode pad with multiple connections to the ring-shaped gate. Moreover, in a DC/AC inverter embodiment, each flexible diode of the plurality comprises a given flexible substrate, a given insulating layer on the given substrate, a given ring-shaped oxide semiconductor channel on the given insulating layer, a given ring-shaped source and a given circular drain, wherein the given source and the given drain are concentric and the given source and the given drain are over the given insulating layer and in contact with the given ring-shaped oxide semiconductor channel, a given insulating gate dielectric layer on the given ring-shaped oxide semiconductor channel, a given ring-shaped gate on the given insulating gate dielectric layer, wherein there is a given offset region between the given ring-shaped gate and the given ring-shaped source and where, the given gate, the given source, and the given drain are concentric and a terminal of the given gate is connected to a terminal of the given drain. Each flexible diode also includes a given source electrode pad with multiple connections to the given ring-shaped source and a given gate electrode pad having with connections to the given ring-shaped gate. According to an embodiment, in each respective pairing, the given flexible diode and the given f-HVTFT are connected in parallel.

It is noted that herein, the aspects of the f-HVTFT, such as materials and dimensions, may be modified so as to perform optimally for each specific application.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

FIG. 1d is a table of material lists that may be employed as gate electrode, channel, gate dielectric, source, and drain electrodes in embodiments of the f-HVTFT.

FIG. 4b is a plot illustrating transfer characteristics of a f-HVTFT built on the PEN substrate depicted in FIG. 4a.

FIG. 4c is a plot showing the gate leakage current of a f-HVTFT built on the PEN substrate depicted in FIG. 4a.

FIG. 6a is a photograph of a bending platform, where f-HVTFTs built on a PEN substrate are undergoing bending testing.

FIG. 6b is a schematic diagram illustrating strain parameters of a f-HVTFT in the bending platform of FIG. 6a.

FIG. 6c is a diagram illustrating a f-HVTFT undergoing parallel bending.

FIG. 6d is a diagram illustrating a f-HVTFT undergoing perpendicular bending.

DETAILED DESCRIPTION

Figure 1A:
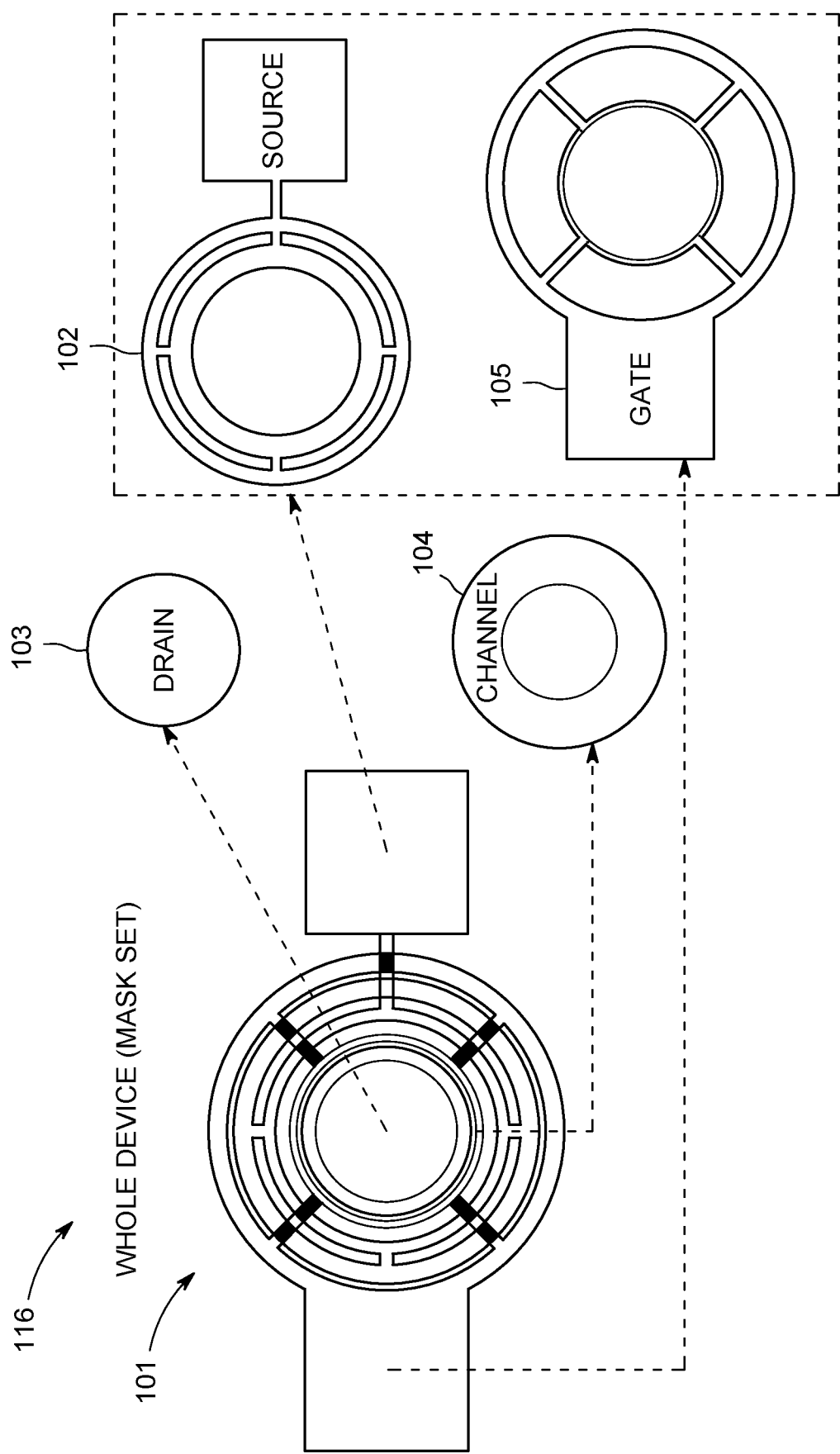
FIG. 1a is a schematic diagram depicting a top view of a f-HVTFT device according to an embodiment with a bottom gate configuration and the dashed box also depicting the source and gate patterns.

A description of example embodiments follows.

Embodiments provide oxide-based flexible high voltage thin film transistors (f-HVTFT) that can be employed in a variety of applications. One such example implementation where embodiments are particularly advantageous is self-powered wearable electronics. In wearable systems, the network of physical objects can be controlled and interacted with wirelessly through existing information technologies, such as Bluetooth, Wi-Fi, smart phone, and cloud computing. The electronic devices associated with wearable electronics, such as receivers and sensors are mounted on flexible and bendable surfaces to facilitate use. In conventional wearable systems, long-life and rechargeable batteries are usually used to power the system. However, for many applications, self-powered flexible and portable electronics are preferred because such self-powered wearable electronic systems are more convenient for users and environmentally friendly.

Scientists and engineers have investigated different nano-generators (power generators), from three major energy sources for wearable electronics: (1) biomechanical energy from the movement of the user, e.g., human, (2) solar energy, and (3) thermal energy from the temperature difference between the user and environment. However, most self-powered technologies using nano-generators, such as piezoelectric nano-generators, have low efficiency and thus, only provide low power. Therefore, these existing nano-generators are unable to provide sufficient energy to power wearable electronics.

For wearables, another critical issue is that, generally, energy harvesting from environmental sources is unstable. However, in wearables, it is important to have constant voltage and current so as to power the regular electronics, e.g., media players, temperature sensors, UV detectors, and LED displays. Thus, it is highly desired to have a power management component to control the storage, conversion, and usage of energy, so as to enable providing constant voltage and current to power electronics in wearable systems.

Recently, a triboelectric nano-generator (TENG) was introduced by Fan et al., "Transparent triboelectric nano-generators and self-powered pressure sensors based on micropatterned plastic films," Nano Lett. 12, 3109 (2012), the contents of which are incorporated herein by reference. Triboelectric nano-generators provide increased power that is sufficient to drive numerous electronics, such as a magnetic sensor, liquid crystal display (LCD), and light-emitting diode (LED) display. Seung et al., Nanopatterned textile-based wearable triboelectric nanogenerator," ACS Nano 9, 3501 (2015), the contents of which are incorporated herein by reference, demonstrated a nano-patterned ZnO/PDMS/Ag based triboelectric energy harvester which generated over a milliwatt of power from 120V and 65 µA on a textile substrate. The typical output characteristics of triboelectric nano-generators are high voltage and low current. Utilizing a nano-generator to power electronics requires converting high voltage, e.g., ~100V, to regular voltage, e.g. ~5V.

A power management component is needed to employ a triboelectric nano-generator as an energy source for portable or wearable electronics. However, conventional power controllers are bulky, rigid, and unsuitable for wearable electronics. Conventional power controllers are built on rigid substrates, such as silicon or glass, separated from the nano-generators. Because the power controllers are on separate and rigid substrates, extra wiring is required to connect the power controller and the nano-generator. Moreover, these rigid substrates are intrusive to users when used in wearable and mobile applications and further, negatively affect the appearance of wearables. For wearable systems, the power controller should be integrated with the nano-generators on a single flexible substrate, e.g., plastic, fabric, textile. Such an integrated system is not only small in size and flexible, but, also improves efficiency by removing external wirings between nano-generators and the power controller. Thus, such a device can be used to charge wearable batteries and directly drive electronic devices under vastly different environmental conditions.

To develop an integrated power management system for wearable electronics, a high voltage transistor fabricated on a flexible substrate at a low process temperature is needed. Moreover, in order to be power efficient, the high voltage transistor is required to provide low specific on-resistance in the ON state and high blocking voltage in the OFF state. A thin film transistor (TFT) is more suitable than a MOSFET as a flexible high voltage device because MOSFETs are typically fabricated on a rigid silicon substrate.

Several semiconductor materials, such as amorphous silicon and polycrystalline silicon have been utilized as a channel layer material for high voltage thin film transistors. However, the aforementioned materials have not been built on flexible substrates except for regular voltage applications and these conventional silicon based transistors are not transparent because of their small bandgap. In addition, amorphous silicon thin film transistors have low mobility and therefore, slow speed. Existing poly-silicon transistors are more suitable for higher speed circuits; however, these existing devices are not suitable for wearable electronics because they are vulnerable to mechanical strain. The poly-silicon transistors also require high process temperatures to fabricate and therefore, are incompatible with flexible substrates. Moreover, silicon based thin film transistors suffer from the absorption of visible light and, thus, are unsuitable for applications involving transparent electronics.

Organic semiconductor materials can be used to fabricate transistors at low process temperatures. Recently, Smith et al., *IEEE Trans. Electron Devices,* 2015, 62, 4213, the contents of which are herein incorporated by reference, showed a high-voltage organic thin-film transistor (HVOTFT) that can operate at 400V. However, the low on-current of ~0.3 µA at $V_{DS}$=100V, which yields the high specific on-resistance $R_{on}$~6.67×10$^3$ ohm-cm$^2$ due to low mobility, makes the HVOTFT unable to directly connect to the nano-generators of self-powered wearable systems because said nano-generators have a higher output current level. Further, due to the low mobility and the properties of the organic materials, the high voltage organic transistors suffer from stability and reliability issues. Because of these drawbacks, organic high voltage thin film transistors are not suitable for use in self-powered wearable electronics, which operate in complicated environments, that include high humidity environments, and environments subject to significant temperature variations.

Oxide semiconductors, such as indium-gallium-zinc-oxide (IGZO) based semiconductors described in, Jeong et al., *Semicond. Sci. Technol.* 2013, 28, 25015, have been used to develop high voltage thin film transistors on rigid substrates. However, IGZO devices are not suitable for wearable systems because of: (i) the high cost of indium, (ii) environmental pollution caused by the toxicity of high indium concentration in the IGZO composition, and (iii) the safety concern for applications in human-worn wearable systems caused by toxicity of high indium concentration in IGZO devices.

Recently, Marette et al., Adv. Mater. 2017, 1700880. demonstrated a flexible Zinc-Tin Oxide high voltage TFT for integrated switching of dielectric elastomer actuator arrays. The device described in Marette could sustain high drain bias (65~1100V) at ON state; however, the blocking voltage at OFF state was not presented. The on/off ratio was less than 2 orders. The high $R_{ON}$ of 2.76×10$^6$ ohm-cm$^2$ and high off-current of 6 µA would lead to poor power efficiency and high standby power which are not suitable for power management in wearable electronic systems. Furthermore, the Marette device is fabricated at a high process temperature (up to 450° C.) making it incompatible with flexible substrates.

Embodiments of the present invention solve the aforementioned problems and provide a ZnO-based flexible high voltage thin film transistor (f-HVTFT) fabricated at a low temperature, e.g., less than 110° C. Embodiments provide a "green" power management device because they are indium-free and can be integrated into a power management system for self-powered wearable electronics.

ZnO-based semiconductor materials have several advantages in high voltage applications, such as wider bandgap, high mobility even in low crystallinity, and low process temperature. Moreover, many energy harvesters are based on ZnO materials as reported in Ha et al., "Triboelectric generators and sensors for self-powered wearable electronics," *ACS Nano* 9, 3421-3427 (2015); Dagdeviren et al., "Transient, biocompatible electronics and energy harvesters based on ZnO," *Small* 9, 3398-404 (2013); Fan et al., "Flexible Nanogenerators for Energy Harvesting and Self-Powered Electronics," *Adv. Mater.* 1-23 (2016). doi: 10.1002/adma.201504299; and Seung et al., "Nanopatterned Textile-Based Wearable Triboelectric Nanogenerator," *ACS Nano* 9, 3501-3509 (2015), the contents of which are herein incorporated by reference. Thus, in embodiments, integrating the ZnO-based nano-generator and power management circuit in the same chip is easier if both are made up of the same materials and this integration can be done using compatible microelectronic fabrication processes.

FIG. 1a is one such example of a f-HVTFT 101 according to an embodiment. FIG. 1a depicts a schematic of the entire photolithography mask set 116 of the f-HVTFT 101. The mask 116 shows the source 102 (including the source electrode pad, i.e., connection pad), the drain 103, the channel 104 between the drain 103 and the source 102, the gate 105 (including the gate electrode pad, i.e., connection pad). In an embodiment, the drain 103, gate 105, source 102, and channel 104 are vertically aligned such that each structure is concentric, i.e., has the same center so that the centers of each element are vertically aligned.

Figure 1B:
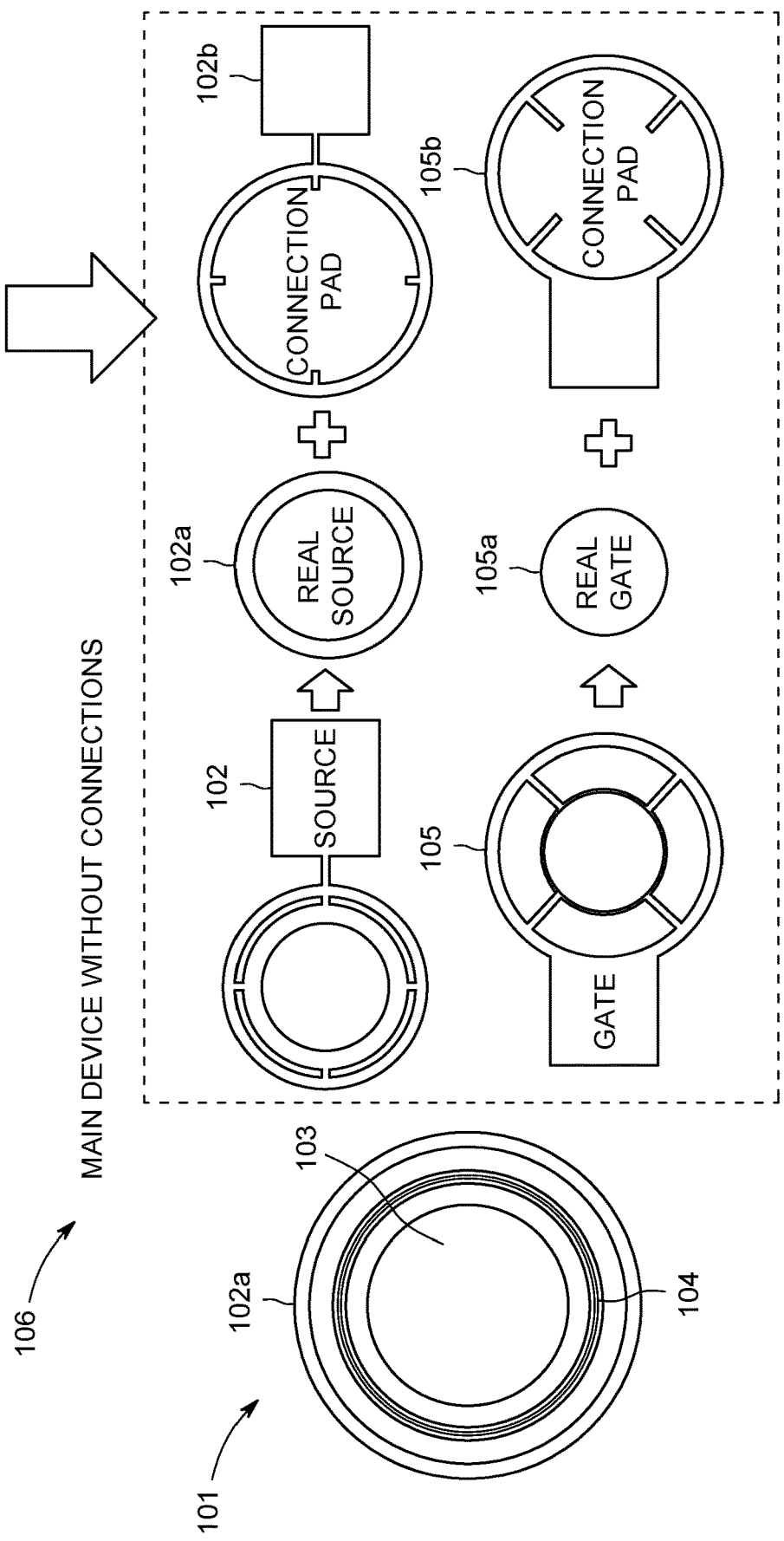
FIG. 1b is a top view of an embodiment of the f-HVTFT without connections. The dashed-line box depicts a source comprising a real ring-shaped source pattern and a source connection pad with multiple electrical contacts to the real ring-shaped source pattern and a gate comprising a ring-shaped real gate pattern and a gate connection pad with multiple electrical contacts to the real ring-shaped gate pattern.

In FIG. 1b, the left part of the figure illustrates a top view 106 of the f-HVTFT 101 without the source connection pad 102b and the gate connection pad 105b. The top view 106 depicts the f-HVTFT 101 with the drain 103 at the center and the source 102a at the outside of the f-HVTFT 101, while the channel 104 is between the drain 103 and source 102a of the f-HVTFT 101.

In FIG. 1b, the dashed line box on right side depicts the source (generally referenced as 102) and gate (generally referenced as 105) of the f-HVTFT 101. The source 102 is composed of the "real source," i.e., a ring-shaped electrode pattern 102a and the source connection pad 102b. Similarly, the gate 105 is composed of the "real gate," i.e., a ring-shaped electrode pattern 105a, and the gate connection pad 105b.

In the f-HVTFT 101, the source 102 has the conductive connection pad 102b which has multiple connections between the pad 102b and the real source 102a and likewise, the gate 105 has the conductive connection pad 105b which has multiple connections between the pad 105b and the real gate 105a. This unique design (multiple connections between the source and source electrode and gate and gate electrode) enhances the strength of the f-HVTFT 101 against bending in arbitrary directions. According to an embodiment, each connection pad 102b and 105b have four electrical connections which are equally distributed in 90° along their circumference. In yet another embodiment, the four connections between the source 102a and source connection pad 102b are located at 0°, 90°, 180°, and 270° directions and the four connections between the gate 105a and gate electrode pad 105b are located at 45°, 135°, 225°, and 315° directions. Further, it is noted that embodiments of the f-HVTFT 101 are not limited to four connections between the gate and gate electrode pad and source and source electrode pad.

Figure 1C:
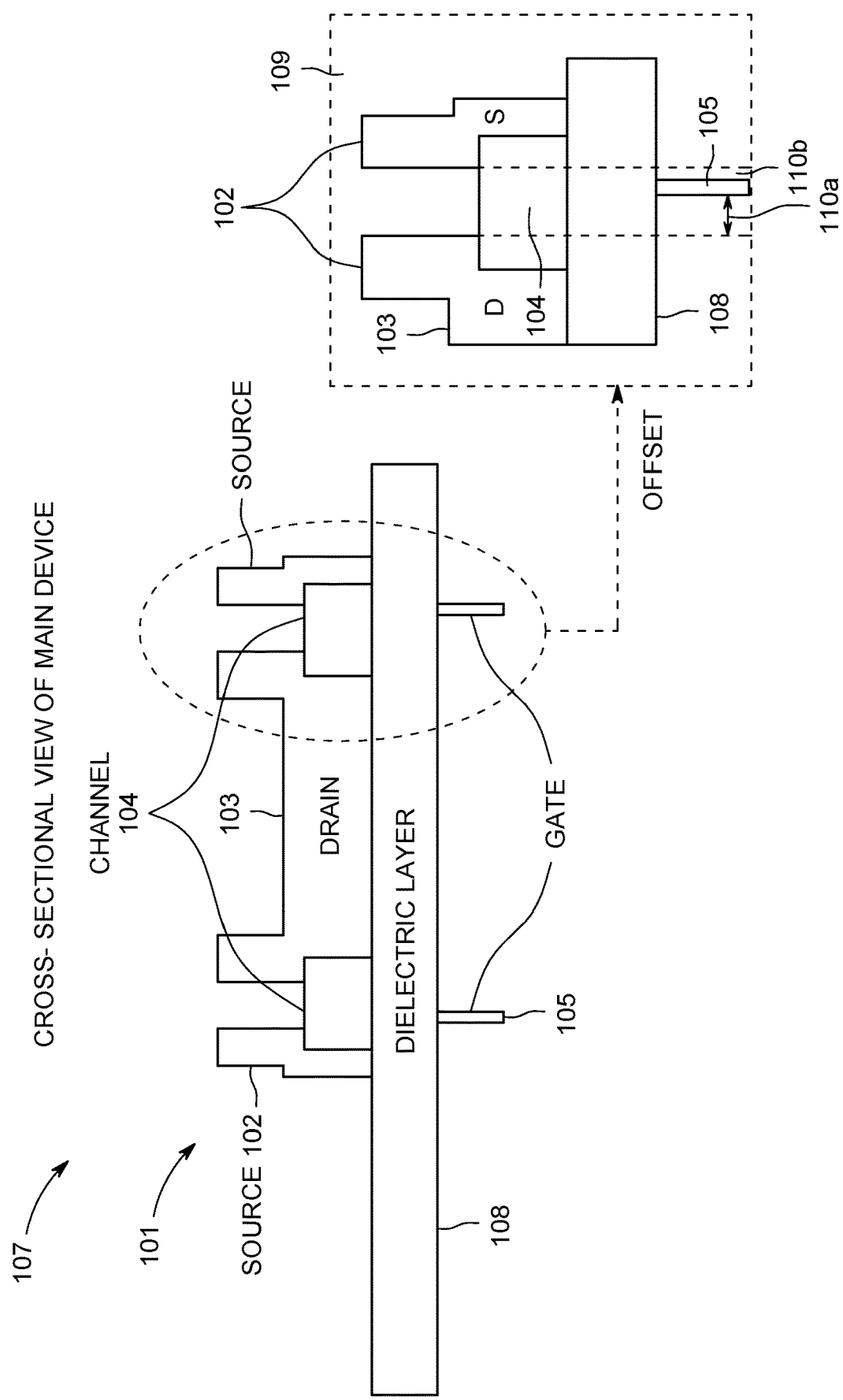
FIG. 1c is a cross-sectional view of the f-HVTFT with a bottom gate configuration including an inset illustrating the gate location and the offset regions according to an embodiment.

FIG. 1c depicts a cross sectional view 107 of the f-HVTFT 101 (without a flexible substrate). The vertical layer structure of the f-HVTFT 101 includes the ring-shaped gate 105, an insulating gate dielectric layer 108 which is on the gate 105, the ring-shaped semiconductor channel 104 which is on the insulating gate dielectric layer 108, and the ring-shaped source 102 and the circular drain 103 which are arranged on top of the dielectric layer 108. In the f-HVTFT 101 the source 102 and drain 103 are electrically contacted to the semiconductor channel 104. The cross sectional view 107 also schematically illustrates the lateral dimension of the f-HVTFT 101 which, from the center along the radius, includes: the drain 103, channel 104, and source 102.

FIG. 1c also depicts the enlarged cross section view 109. The enlarged view 109 shows the source 102, drain 103, channel 104, dielectric layer 108, and gate 105. The view 109 illustrates the alignment and the lateral relationship between the source 102, drain 103, channel 104, and gate 105. Particularly, the enlarged view 109 illustrates the offset region 110a between the drain 103 and the gate 105, and the offset region 110b between source 102 and the gate 105. By including offset(s) and adjusting dimensions of the offset(s), such as the drain-gate offset 110a and/or the source-gate offset 110b, the f-HVTFT 101 can provide the proper high blocking voltage and on-current to meet the requirements of specific power management for self-powered wearable systems. Further detail regarding the offsets 110a and 110b are described herein below in relation to FIG. 2.

FIG. 1d is a material list 111 that indicates various materials used to fabricate the f-HVTFT 101. The materials list 111 indicates conducting materials 112 for the source 102 and drain 103, dielectric material 113 for the gate dielectric layer 108, oxide semiconductor materials 114 for the channel layer 104, and conductive material 115 for the gate 105. According to an embodiment, the conducting materials 112 for the source 102 and drain 103 are composed of opaque metals such as titanium-gold (Ti/Au) alloys; or transparent conductive oxides such as gallium-doped zinc oxide (GZO) or aluminum-doped zinc oxide (AZO). The conducting electrode material 115 for the gate 105 is composed of opaque metals like chromium-based alloys or titanium-based alloys, or transparent conductive oxides like GZO or AZO. As shown in the material list 111, in an embodiment, the insulating gate dielectric material 113 includes $SiO_2$, or a high dielectric constant (high-K) material such as $Al_2O_3$ or $HfO_2$. In an alternative embodiment, the dielectric layer 108 is composed of a multi-layer stack of high-k materials, such as a $SiO_2$ and $HfO_2$ stack, amongst other examples. In an embodiment, the oxide semiconductor materials 114 for the channel 104 include ZnO or MZO.

According to an embodiment of the f-HVTFT 101, the insulating gate dielectric layer 108 is a multi-layer dielectric stacking structure composed of at least one of: $SiO_2$, $Al_2O_3$, $HfO_2$, and MgO. According to an embodiment, total thickness of the multi-layer dielectric stacking structure is between 50 nm and 300 nm. In an embodiment, the multi-layer dielectric stacking structure comprising the insulating gate dielectric layer 108 has an effective thickness between 50 nm and 300 nm. In another embodiment, the insulating gate dielectric layer 108 is a single insulating layer with a thickness between 50 nm and 300 nm. The specific structure and thickness of the dielectric layer in the f-HVTFT 101 is determined based upon the application requirements such as blocking voltage and on-current values and the material properties of the f-HVTFT 101. Depending on the application requirements and/or the material properties of the f-HVTFT 101, the thickness of the dielectric layer can be outside of the range of 50 nm-300 nm.

According to an embodiment, the flexible substrate of the f-HVTFT 101 is transparent or opaque. In an embodiment, the flexible substrate is composed of at least one of: polymide, plastics, PEN, bendable glass, paper, metal and textiles. In an embodiment, PEN is used as the flexible substrate because, as described in, Brotherton, S. D., "*Introduction to thin film transistors: Physics and technology of TFTs,*" Introduction to Thin Film Transistors: Physics and Technology of TFTs 9783319000, (Springer International Publishing, 2013): (i) PEN has a lower CTE of 13 ppm/K than PI (17 ppm/K) and PAR (53 ppm/K) and (ii) PEN has high transparency (>85%) which is much better than PI (30~60%). Moreover, because the flexible substrate is composed of at least one of: polymide, plastics, Polyethylene Naphthalate (PEN), bendable glass, paper, metal and textiles, the f-HVTFT, according to an embodiment, is fabricated at temperatures compatible with the foregoing substrate materials.

As shown in FIGS. 1c and 1d, in an embodiment, the channel 104 is composed of at least one of: ZnO and Magnesium Zinc Oxide (MZO). In an embodiment, the channel 104 may be composed of ZnO, pure ZnO, doped ZnO, ZnO based semiconductor heterostructures, and ZnO alloys, such as Magnesium Zinc Oxide ($Mg_xZn_{1-x}O$) where 0<x<0.06. According to an embodiment, the insulating gate dielectric layer 108 is composed of at least one of: $SiO_2$, $Al_2O_3$, $HfO_2$, and MgO. In yet another embodiment, the dielectric insulating layer 108 is a multi-layer dielectric structure composed of at least one of: $SiO_2$, $Al_2O_3$, $HfO_2$, and MgO. In such an embodiment, the multi-layer dielectric structure may include multiple layers of a single material, e.g., $SiO_2$ or multiple layers of different materials, e.g., $SiO_2$ and $HfO_2$. The material listing 111 also indicates that, according to an embodiment, the source 102 and drain 103 are composed of titanium or gold and the gate 105 is composed of chromium.

Figure 2:
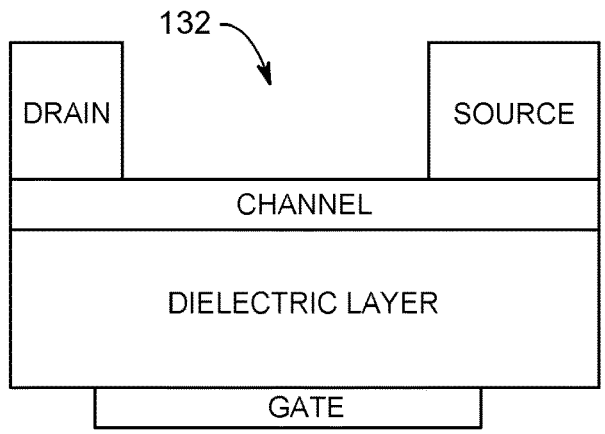
FIG. 2 illustrates schematic cross section diagrams of three cases: case 1 showing a conventional thin film transistor without offset region; case 2 showing the f-HVTFT with one offset region between the gate and drain; case 3 showing the f-HVTFT with two offset regions: one is between gate and drain and the other is between source and gate in f-HVTFTs according to embodiments.
Figure 2:
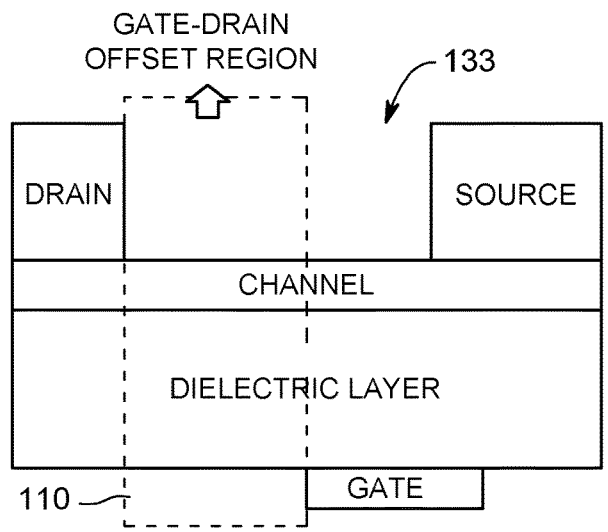
Figure 2:
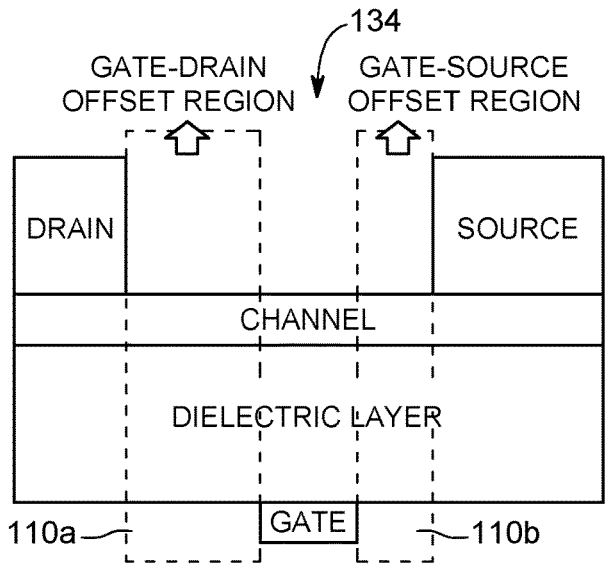

FIG. 2 illustrates various designs for offset regions that may be employed in embodiments. In contrast to embodiments of the present invention, the cross sectional view 132 (Case 1) illustrates a conventional thin film transistor (TFT) where there is no offset between the drain and gate and there is no offset between the source and gate. In the conventional TFT depicted in the view 132, the gate pattern overlaps with the drain and source (in the lateral dimension). The conventional TFT with such a design in the cross sectional view 132 is generally used to provide a large conduction current and low voltage.

In contrast to the conventional TFT device in the cross sectional view 132, the cross sectional views 133 and 134 illustrate f-HVTFTs according to embodiments of the present invention where there are offset regions. In the cross sectional view 133 (Case 2), there is the offset 110 between the drain and gate. In the cross sectional view 134 (Case 3), there are two offset regions, the offset 110a between the drain and gate and the offset 110b between the source and gate. In contrast to the conventional TFT depicted in the view 132, the offsets 110 and 110a-b provide the voltage blocking characteristics needed in the f-HVTFT of embodiments of the present invention.

The blocking voltage $V_{block}$ is defined as the highest drain bias that a TFT can sustain without a breakdown in the OFF state ($V_{GS}$=0V). The wider offset region increases the blocking voltage, however, reduces the conduction current. The cross-sectional view 133 illustrates an embodiment of the present invention where there is an offset 110 between the drain and the gate; however, there is no offset between the gate and source. By adjusting the offset dimension in the cross sectional view 133, the f-HVTFT of such an embodiment provides a medium blocking voltage and high on-current that matches the output characteristics of a power generator used in wearable systems.

The cross-sectional view 134 depicts a f-HVTFT according to an embodiment of the present invention that includes two offset regions, an offset 110a between the drain and gate and an offset 110b between the source and the gate. With optimized offset dimensions, the f-HVTFT depicted in the view 134 provides higher blocking voltage, but lower on-current compared to the f-HVTFT depicted in the view 133.

Compared with the conventional TFT depicted in the view 132, the on-current of the f-HVTFT depicted in the view 134 is severely depressed due to the series resistance of the offset regions 110a and 110b. A specific breakdown voltage in the conventional TFT is not known, however the measurement was limited to 20V. In an embodiment, Vbr is in the range of 20-30V for a 50 nm thick $Al_2O_3$ dielectric and 2 μm overlap. In the device depicted in the view 133, an offset on the source side is not necessary because in this embodiment, the high drain voltage drops on the drain side and the weak point is located at the gate edge of the gate drain offset region. A source-side of the gate-source offset region would decrease the on-current, however it would not significantly affect the breakdown voltage.

According to an embodiment, the width of the offset, e.g., 110, 110a and 110b, is designed based upon operating conditions and the specific application in which the f-HVTFT will be employed. For example, in an embodiment where the f-HVTFT has a higher voltage bias added on a drain terminal, the offset 110a between the drain and gate is larger in order to sustain the higher blocking voltage. In an embodiment, for example, a 2 μm offset 110a between the drain and gate allows the f-HVTFT to have a blocking voltage, $V_{block}$, of 110V. In another embodiment, for example, a 5 μm offset 110a between the drain and the gate yields the blocking voltage, $V_{block}$, of more than 200V.

Figure 3A:
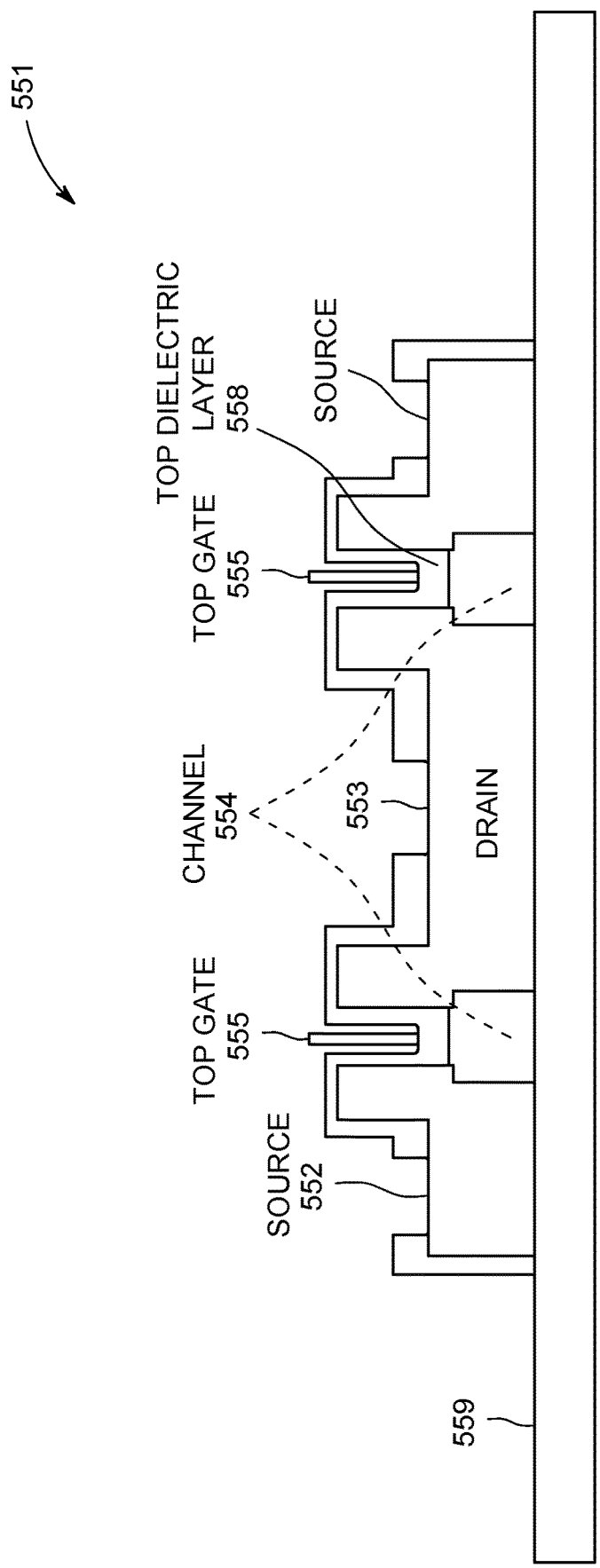
FIG. 3a is a schematic diagram depicting a cross sectional view of a f-HVTFT device having a top gate configuration, according to an embodiment.

FIG. 3a is a schematic diagram depicting a cross section view of a f-HVTFT 551 having a top gate configuration. The f-HVTFT 551 is center symmetric and the source 552, the drain 553, channel 554, and gate 555 are concentric. The f-HVTFT comprises a flexible substrate (not shown) with an insulating layer 559 on the flexible substrate and a ring-shaped oxide semiconductor channel 554 on the insulating layer 559. The f-HVTFT includes a ring-shaped source 552 and a circular drain 553, wherein the source 552 and the drain 553 are concentric and the source 552 and the drain 553 are over the insulating layer 559 and in contact with the ring-shaped oxide semiconductor channel 554. Further, the f-HVTFT 551 includes an insulating gate dielectric layer 558 on the ring-shaped oxide semiconductor channel 554 and a ring-shaped gate 555 on the insulating gate dielectric layer 558, wherein there is an offset region between the ring-shaped gate 555 and the circular drain 553. The f-HVTFT 551 also includes another offset between the ring-shaped gate 555 and the ring-shaped source 552.

While not shown, the f-HVTFT 551 with the top gate configuration further includes a source electrode pad with multiple connections to the ring-shaped source 552 and a gate electrode pad with multiple connections to the ring-shaped gate 555. While the top-gate f-HVTFT 551 is configured differently than the bottom gate f-HVTFT 101 described hereinabove in relation to FIGS. 1a-d and 2, the f-HVTFT 551 may have the same or similar features as the f-HVTFT 101 and likewise, may be composed of the same materials in the same manner. Moreover, the f-HVTFT 551 may use electrode structures as described herein in relation to embodiments of the f-HVTFT with a bottom gate configuration.

Figure 3B:
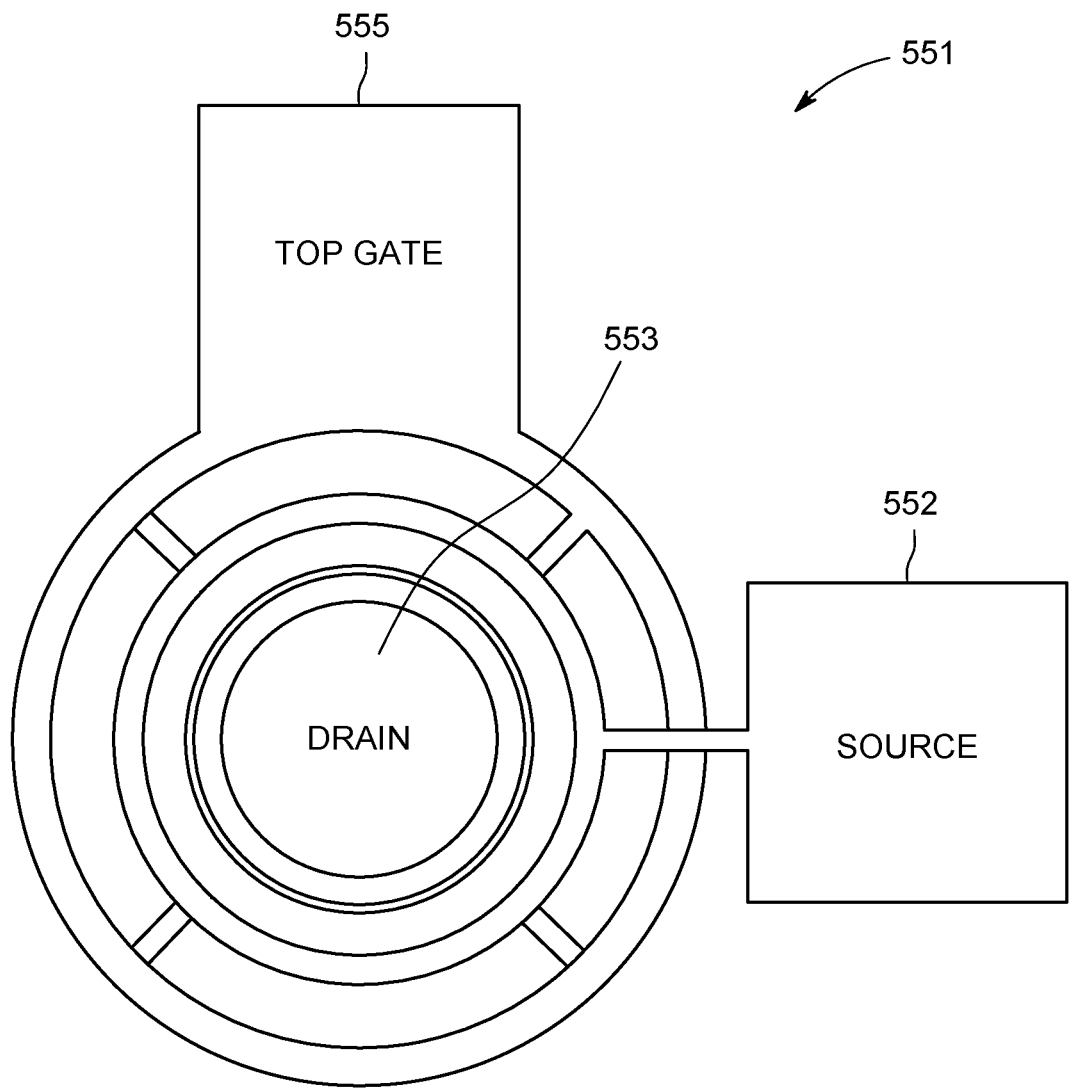
FIG. 3b is a top view of an embodiment of the f-HVTFT having a top gate configuration.

FIG. 3b is a top view of the entire photolithography mask set of the f-HVTFT 551 having a top gate configuration. FIG. 3b depicts the source 552 (including the source electrode pad) and the drain 553 concentric with the source 552. The top view also depicts the top gate 555 (including the gate electrode pad) above the source 552.

As described herein, embodiments of the present invention provide a f-HVTFT on a flexible substrate. Flexible substrate materials, such as PEN, aromatic fluorine-containing polyarylates (PAR), and Polyimide (PI), require lower fabrication process temperatures due to these materials' low transition temperatures and large coefficients of thermal expansion (CTE).

The f-HVTFT, according to embodiments in this invention is fabricated at low temperatures compatible with the flexible substrate. In an embodiment a channel is deposited using radio frequency (RF) sputtering technology which is performed at room temperature. In an embodiment, a gate dielectric layer composed of $Al_2O_3$ is deposited by atomic layer deposition (ALD) at a low temperature (~100° C.). To further reduce the fabrication processing temperature, the liquid processing, the spin-on process, or 3D printing process can be used to fabricate the f-HVTFT on various flexible substrates at low (<100° C.) or even room-temperature.

A f-HVTFT, according to an embodiment, may employ a flexible substrate composed of PEN. Using a PEN substrate can be advantageous for many reasons, including: (i) PEN's lower CTE of 13 ppm/K as compared to PI (17 ppm/K) and PAR (53 ppm/K) and (ii) PEN's high transparency (>85%) which is much better than PI which has a transparency of approximately 30% to 60%.

Although PEN has a lower thermal expansion as compared to other flexible substrates, the thermal expansion of PEN is still significant enough to affect mask alignment. The effect on mask alignment, if not accounted for, can result in low yield production. Thus, in an embodiment, the f-HVTFT is manufactured in such a way so as to account for thermal expansion by degassing the PEN substrates at 110° C. for 12 hours before device fabrication. Because the degassing temperature (110° C.) is slightly higher than the highest process temperature, the degassing prevents additional thermal expansion during the subsequent fabrication processes. In an embodiment, after degassing, the PEN substrate is encapsulated with a 50 nm ALD-$Al_2O_3$ composition. This encapsulation process not only protects the plastic (PEN) substrate from gas adsorption but also, improves the adhesion of metal to the f-HVTFT's gate. Thus, in such an embodiment, thermal expansion of the PEN substrate is minimized by degassing and encapsulating the substrate at a process temperature that is higher than the encapsulation temperature.

Herein below, in relation to FIGS. 4-8, experimental results of f-HVTFTs according to embodiments of the present invention are described. These experimental results were obtained using f-HVTFTs, such as the f-HVTFT 101 described hereinabove in relation to FIG. 1. Specifically, in one embodiment, the f-HVTFTs used were fabricated at low temperatures compatible with the flexible substrates. PEN was used as the flexible substrate because of its low CTE of 13 ppm/K (PI=17 ppm/K and PAR=53 ppm/K) and high transparency of >85% (PI=30~60%). Before fabricating the f-HVTFTs, the PEN substrate was degassed at 110° C. for 12 hours to prevent excessive expansion resulting from heating during the subsequent fabrication processes. Then, the PEN substrate was encapsulated with a 50 nm $Al_2O_3$ coating using ALD to protect the substrate from gas adsorption and to improve the adhesion of the gate metal on the substrate. In turn, a 50 nm chromium (Cr) layer was deposited by DC sputtering as the bottom gate electrode followed by deposition of a 200 nm layer of $Al_2O_3$ as the gate dielectric layer, using ALD at a temperature of ~100° C. Next, an 45 nm ZnO channel layer was deposited by RF sputtering at room temperature. In turn, the source and drain metallization (100 nm titanium/50 nm gold) was deposited using electron beam evaporation, followed by a normal lift-off process. Additionally, a photoresist film was coated on top of the channel to serve as a temporary passivation layer to prevent ambient absorption/desorption during electrical testing.

The electrical measurements under the low bias were conducted using an HP-4156C with an HP-41501B Pulse Generator. Because of the boost from the connection of the pulse generator, the maximum voltage of the HP-4156C electrical testing system was limited to be 200V. The system had a current resolution of $1\times10^{-15}$ A and the HP-4156C was used for determining all transfer characteristics. The specific on-resistance ($R_{ON}$) is defined as the following equation:

$$R_{ON} = \frac{V_{ON}}{I_{ON}} \times A_{Channel}$$

where $V_{ON}$ and $I_{ON}$ are the drain bias and drain current, respectively and $A_{Channel}$ is the area of the channel which is equal to width times length.

Figure 4A:
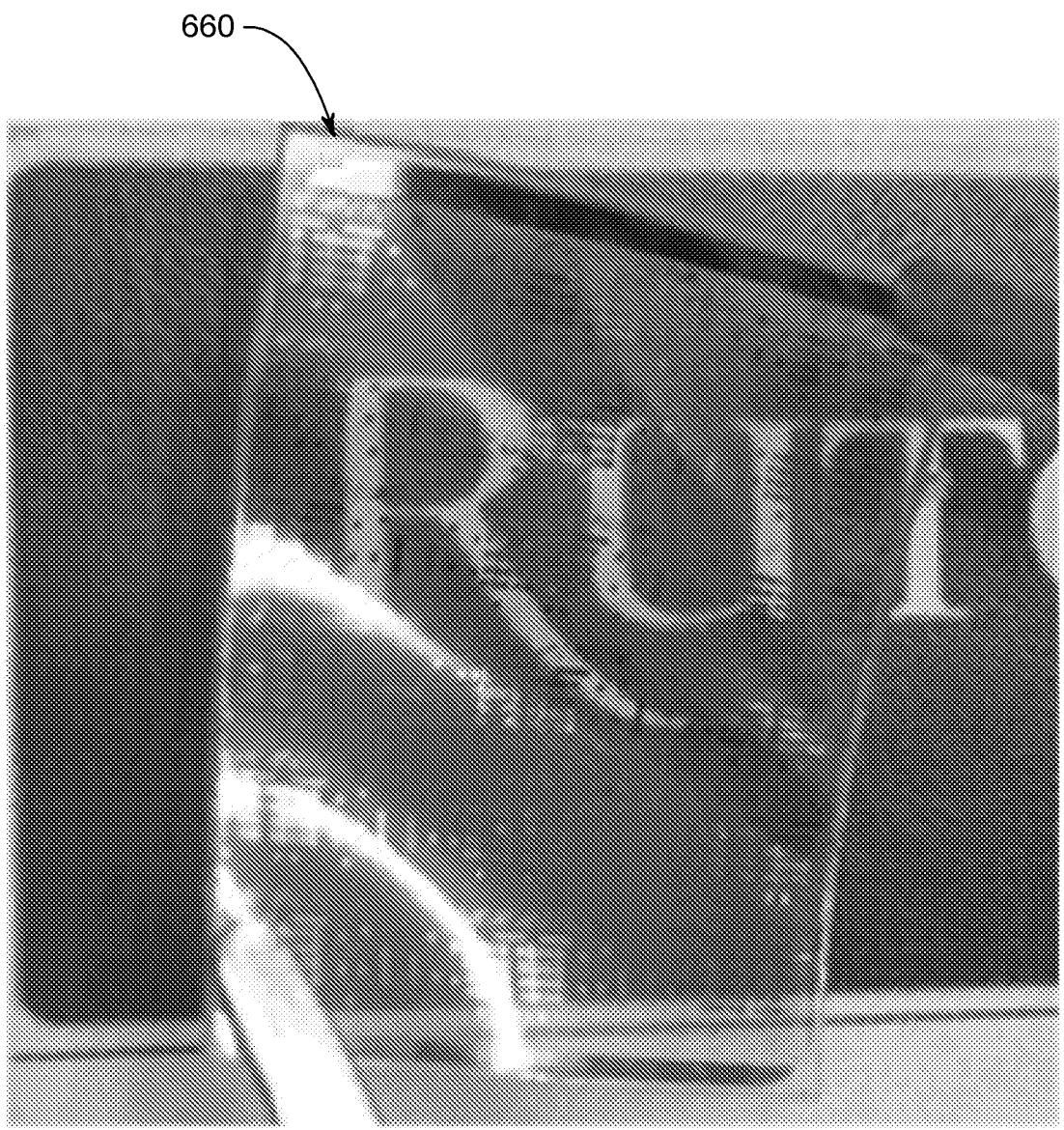
FIG. 4a is a photograph of a PEN substrate, on which many flexible and semi-transparent f-HVTFTs are fabricated according to an embodiment.
Figure 4B:
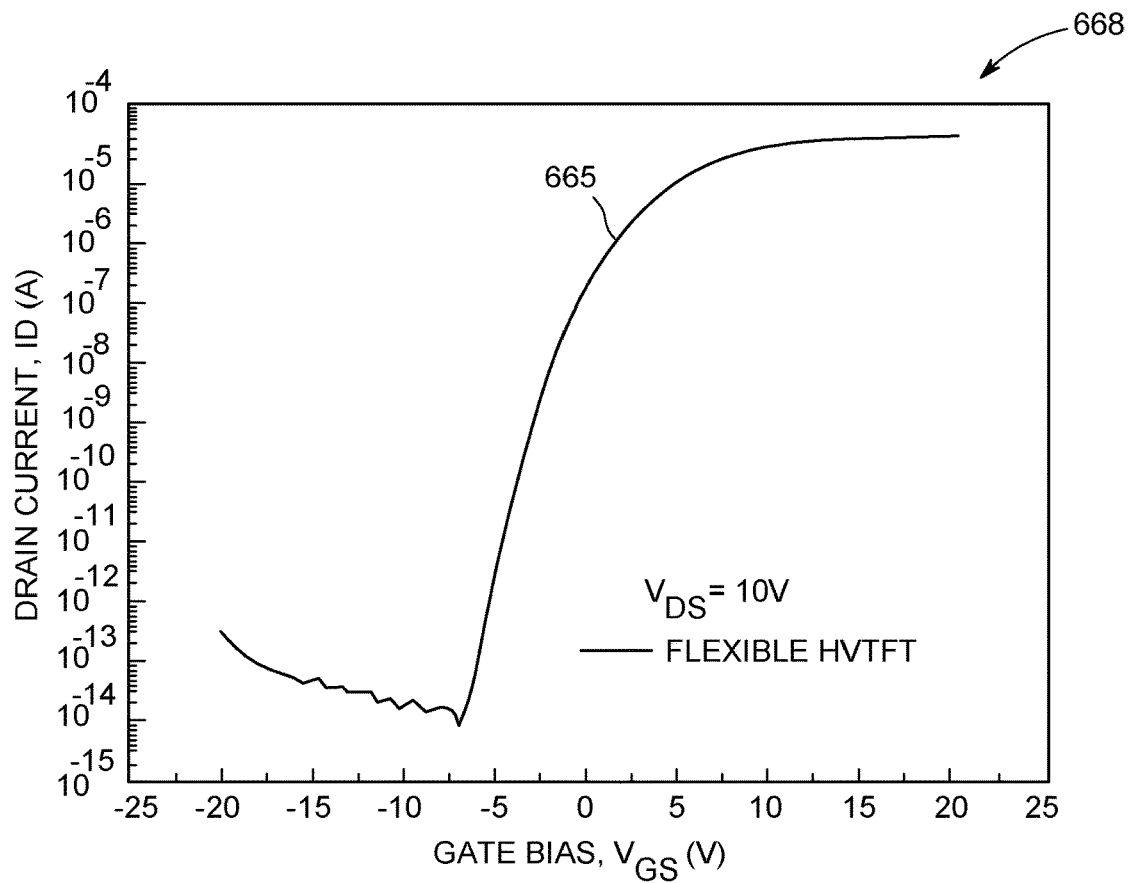
Figure 4C:
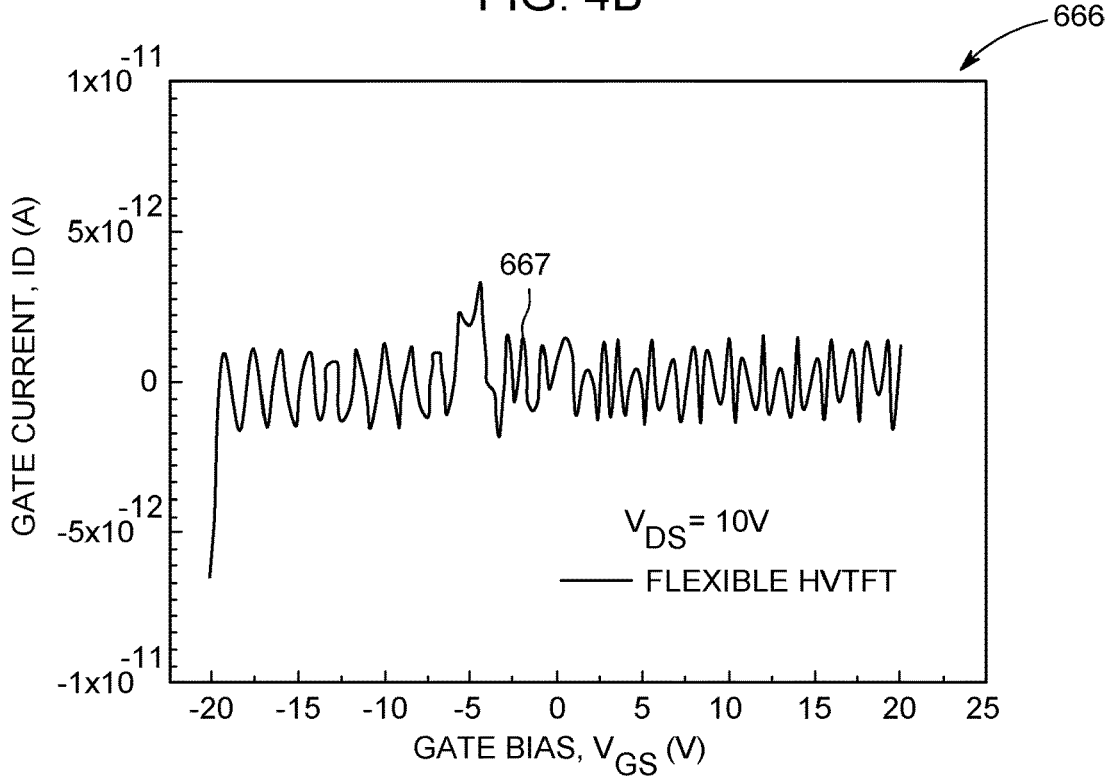

FIG. 4a is a photograph of a flexible wafer 660 on which multiple semi-transparent f-HVTFTs are fabricated according to the aforementioned process. The plot 668 in FIG. 4b depicts the transfer characteristics 665 of a f-HVTFT from the wafer 660. Likewise, the plot 666 in FIG. 4c shows the gate leakage current 667 of one of the f-HVTFTs from the wafer 660.

The measured electrical parameters of a f-HVTFT from the wafer 660 include: (i) threshold voltage of −2.4V, (ii) subthreshold slope of 0.9 V/decade, (iii) on-current of 28 μA, and (iv) ON/OFF current ratio of 109. The areal ON-currents density reaches 0.4 A/cm$^2$ which is two orders higher than the high voltage organic thin film transistor (HVOTFT25). The electrical performance (shown by the plots 668 and 666) of the f-HVTFTs from the wafer 660 is slightly better than the electrical performance of a high voltage thin film transistor on a glass substrate consisting of a MOCVD ZnO channel and PECVD $SiO_2$ structure as described in U.S. Provisional Application No. 62/377,317, the contents of which are herein incorporated by reference. The improved electrical characteristics of the f-HVTFT from the wafer 660 are attributable to the larger gate capacitor of the high dielectric constant material $Al_2O_3$, as well as the improved interface between the ALD $Al_2O_3$ dielectric layer and the sputtering ZnO channel layer. The gate leakage current 667 is a negligible $10^{-12}$ A.

The total trap density, i.e., the number of electron traps per area unit, of the f-HVTFT from the wafer 660 from the subthreshold slope (S.S.) is given by:

$$S.S = \log_e 10 \times \frac{k_B T}{q}\left(1 + q\frac{tN_{bulk} + D_{it}}{C_G}\right)$$

where q is the elementary electric charge, $k_B$ is the Boltzmann constant, T is the temperature in Kelvin, t is the channel thickness, $N_{bulk}$ is the bulk trap density, $D_{it}$ is the interface trap density, and $C_G$ is the capacitance per area of the gate dielectric layer ($C_G$ is 8.23×10-4 F/m$^2$). The theoretical values of $SiO_2$=3.9 and $Al_2O_3$=9.30 are used in this evaluation. The total trap density calculated to be 7.26×10$^{12}$ cm$^{-2}$, comprises the bulk trap (t$N_{bulk}$) density and the interface trap ($D_{it}$) density.

Figure 5A:
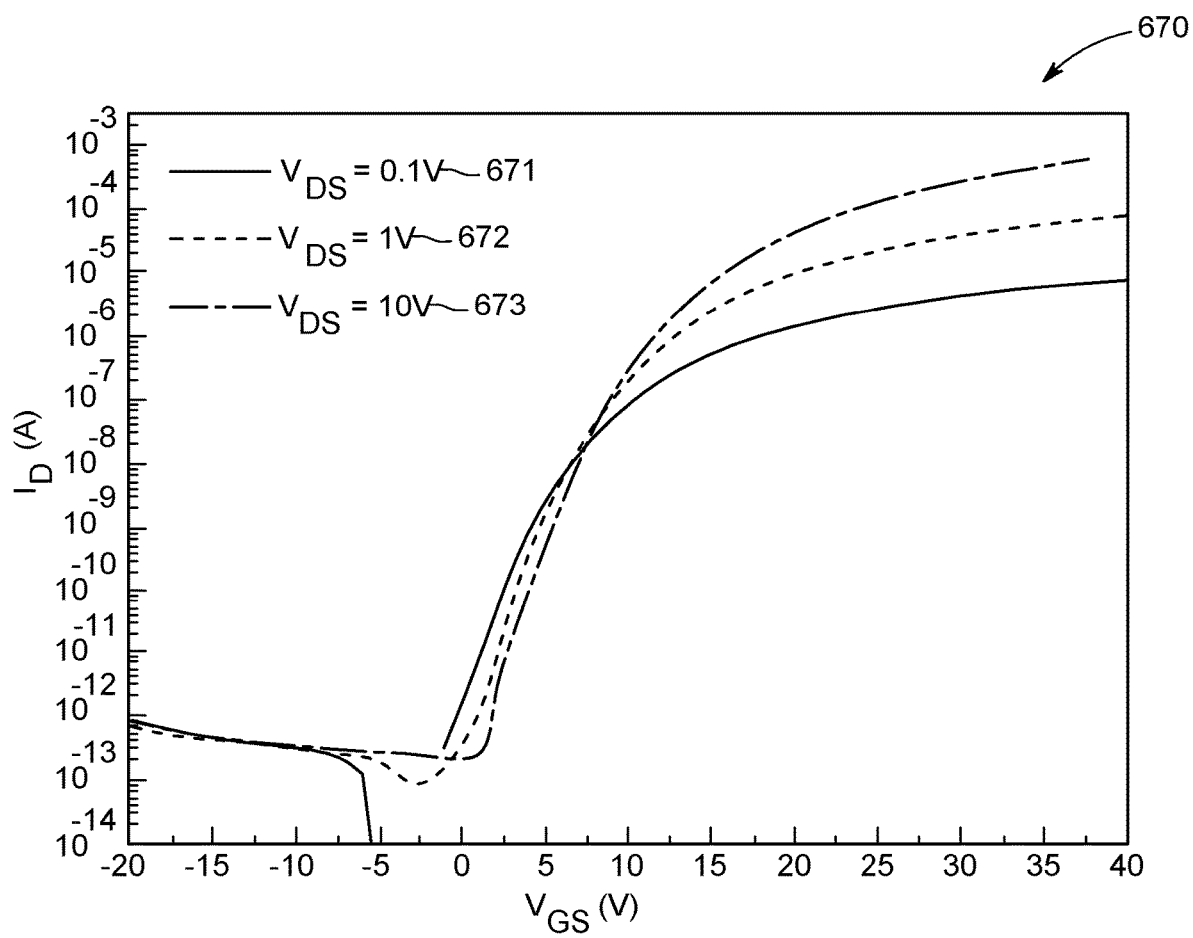
FIG. 5a depicts the transfer characteristics of a ZnO f-HVTFT tested under different drain voltage $V_{DS}$ according to an embodiment.

FIG. 5a illustrates the transfer characteristics 670 of a f-HVTFT 660 according to an embodiment under different $V_{DS}$ values. The plot 670 illustrates the transfer characteristics 671 where $V_{DS}$=0.1V, the transfer characteristics 672 where $V_{DS}$=1V, and the transfer characteristics 673 where $V_{DS}$=10V. In the transfer characteristics 673, when $V_{DS}$=10V and $V_{GS}$=40V, the drain current ($I_D$) reaches 670 μA, and the off-current is as low as 0.1 pA. Threshold voltage ($V_{TH}$) is defined as the gate voltage ($V_{GS}$) value when $I_D$ reaches $10^{-9}$ A with $V_{DS}$=0.1V. The turn-off voltage ($V_{OFF}$) is defined as the gate voltage value when $I_D$ reaches $10^{-13}$ A with $V_{DS}$=10V. It is found that the threshold voltage $V_{TH}$ is 4V and the turn-off voltage $V_{OFF}$ is 1V, respectively. The plot 670 indicates that the f-HVTFT, according to embodiments, has characteristics of normally-off and low off-current enabling low standby power, which is suitable for low power applications, such as portable and wearable electronic systems.

Figure 5B:
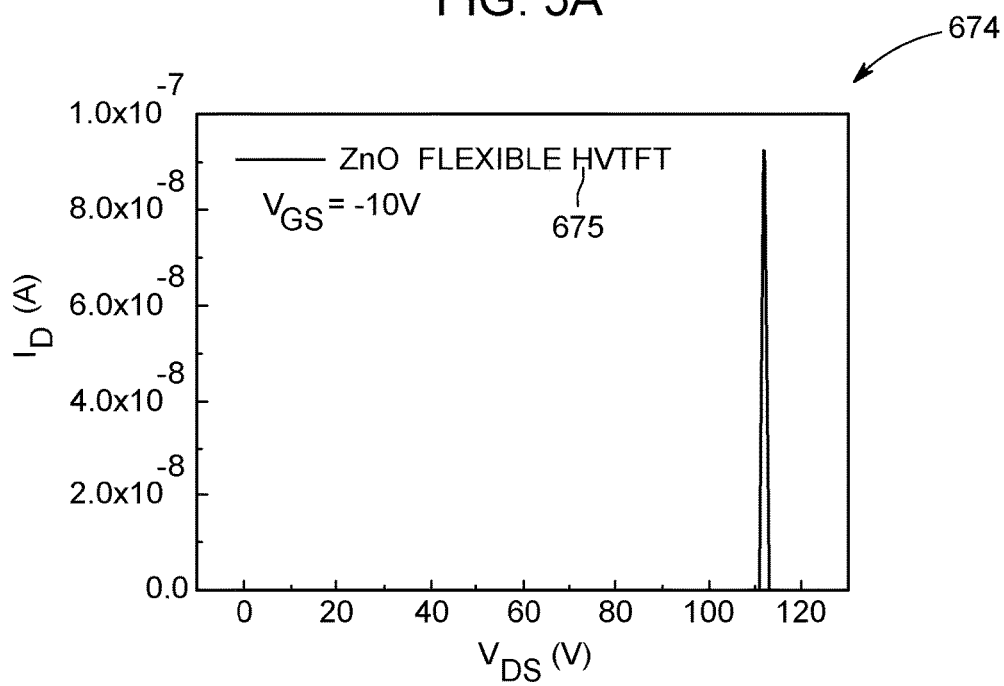
FIG. 5b shows the blocking voltage of a ZnO f-HVTFT of an embodiment of the present invention.

Blocking voltage ($V_{block}$) is defined as the highest drain bias that a thin film transistor can sustain without a breakdown in the OFF state ($V_{GS}$=0V). FIG. 5b illustrates testing results 675 of blocking voltage in the plot 674. The plot 674 illustrates that the f-HVTFT has a blocking voltage around 112V. During testing it was determined that the main breakdown resulted from burnout of the PEN substrate at the drain side. This could be attributed to the self-heating effect. The poor thermal conductivity of the plastic substrate (~0.2 Wm$^{-1}$K$^{-1}$) restricts the heat dissipation from the channel layer. In fact, as described in Miyasaka et al., Jpn. J Appl. Phys. 2008, 47, 4430, this has been a major issue in flexible transistors. In the case of embodiments of the present invention, the self-heating becomes even more severe because the f-HVTFT operates at a much higher voltage than the regular thin film transistor, and a small leakage under the high drain bias can generate considerable joule heat.

As described herein, embodiments of the present invention are particularly advantageous when used in wearable systems because they operate even when subjected to bending from random directions. Two types of bending tests were conducted. The first one was the static measurement, in which the electrical measurements were taken on f-HVTFTs that were flattened after bending. The second bending test was a dynamic measurement, in which the electrical measurements were taken while the devices were strained under bending.

FIG. 6a depicts a platform 780 used to test embodiments of the present invention where the bending radius of f-HVTF81 on a flexible substrate is tuned by adjusting the distance 782 between two clamps 783a and 783b.

FIG. 6b illustrates further detail of the geometric characteristics of a f-HVTFT 781 undergoing bending testing. For the testing described herein, the bending direction is downward which imparts tensile strain to the devices 781 on the substrate. As a reference, the f-HVTFT wafers are also bonded on stainless steel cylinders with different radii to compare and calibrate the strain values in the bending tests.

As described in Kwon et al., *Adv. Mater.* 2008, 20, 4557, the strain values imparted to a transistor like the f-HVTFT 781 undergoing bending are given by the equation:

$$\text{Strain}(\%) = 100 \times \frac{T_{PEN} + T_{TFT}}{2 \times R_C}$$

where $T_{PEN}$ is the thickness of the PEN substrate, $T_{TFT}$ is the thickness of the f-HVTFT, and $R_C$ is the bending radius.

FIG. 6c illustrates a schematic of a bending test where embodiments of the f-HVTFT 781 undergo bending along the direction parallel to the source and gate pads (where the bending direction is indicated by the arrows 785a-b). FIG. 6d illustrates a schematic of a bending test described herein where embodiments of the f-HVTFT 781 undergo bending along the direction perpendicular to the source and gate pads (where the bending direction is indicated by the arrows 786a-b).

Figure 7A:
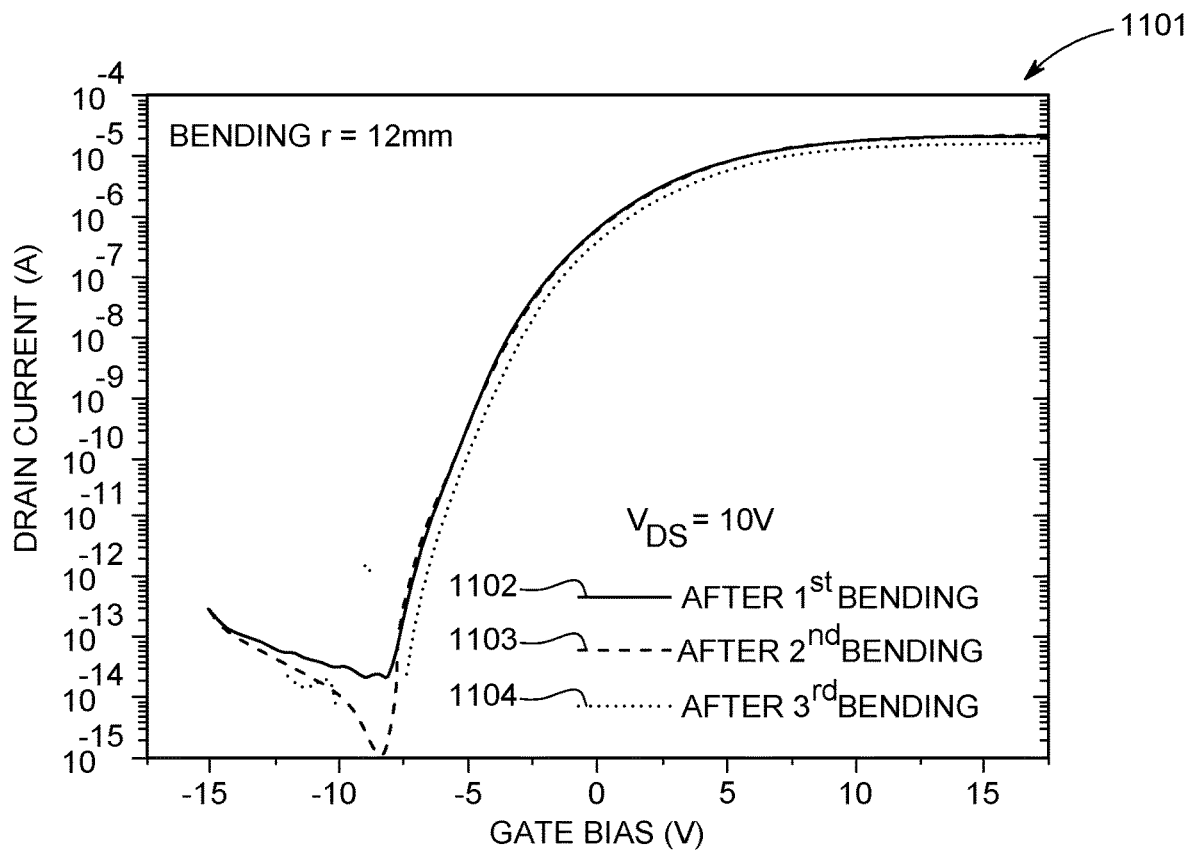
FIG. 7a is a plot showing drain current of a f-HVTFT according to an embodiment undergoing static bending testing where the bending direction is parallel and perpendicular to source and drain contact pads.

Results from static bending tests where the f-HVTFT is subjected to parallel and perpendicular bending are shown in FIG. 7a. In the plot 1101 of FIG. 7a, the characteristics of drain current versus gate biasing voltage of a f-HVTFT after the bending tests, in which the bending is along the parallel (FIG. 6c) and perpendicular (FIG. 6d) to the source and drain contact pads, are shown. The plot 1101 illustrates the drain current versus the gate biasing voltage after the f-HVTFT is bent multiple times, as an example of an embodiment, once 1102, bent twice 1103, and bent three times 1104.

Figure 7B:
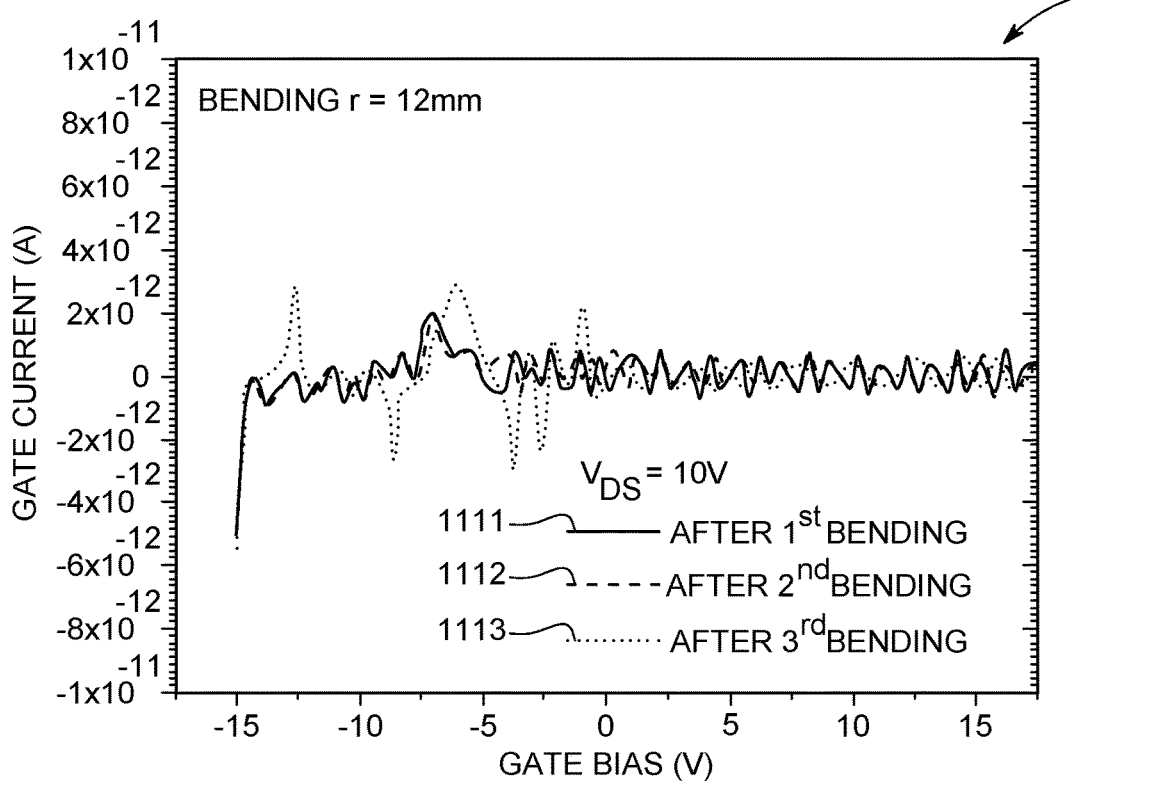
FIG. 7b is a plot showing gate leakage current of a f-HVTFT according to an embodiment undergoing static bending testing where the bending is parallel and perpendicular to the source and drain contact pads.

FIG. 7b shows characteristics of the gate leakage current versus gate biasing voltage of a f-HVTFT in the plot 1110 after bending tests, in which the bending is long the parallel and perpendicular to the source and drain contact pads. The plot 1110 illustrates the gate leakage current versus the gate biasing voltage measured for a f-HVTFT that is flattened after it is bent once 1111, bent twice 1112, and bent three times 1113.

For bending under both parallel and perpendicular directions the measured electrical characteristics are almost unchanged after the f-HVTFT is bent multiple times and the blocking voltage remained larger than 100V. The results indicate that the f-HVTFT recovers well in electrical characteristics and in blocking capability after being mechanically bent and then flattened.

Figure 8A:
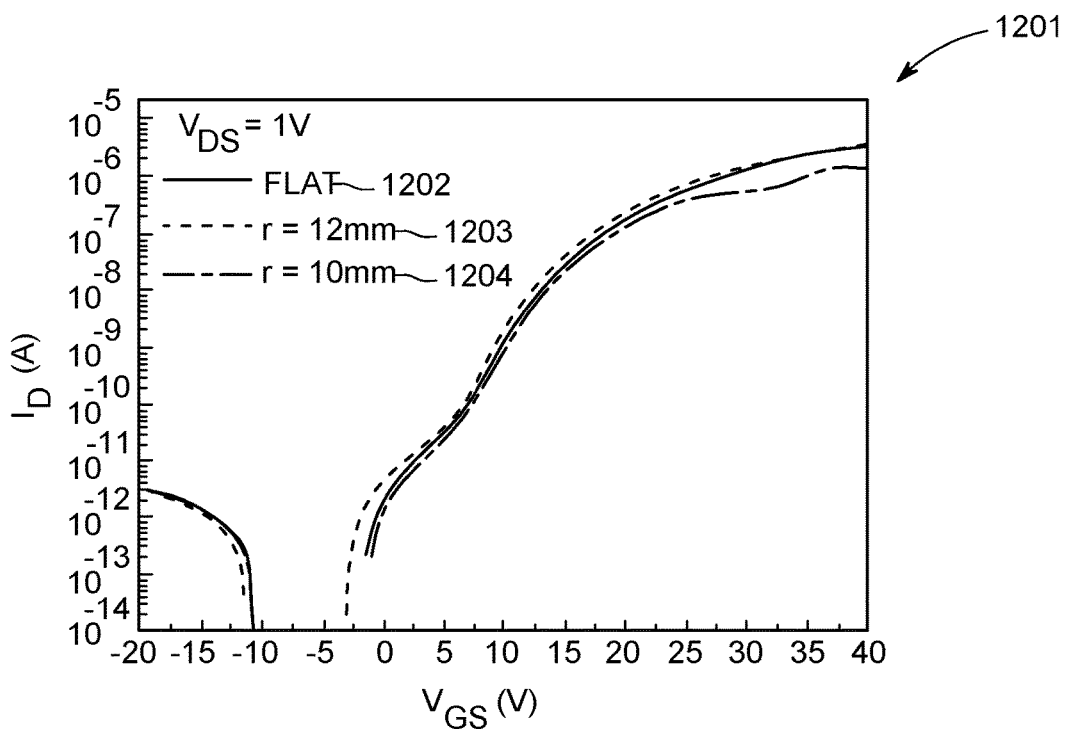
FIG. 8a is a plot showing drain current for a ZnO f-HVTFT according to an embodiment undergoing dynamic bending testing where the bending direction is parallel and perpendicular to the source and drain contact pads.

The dynamic bending test is important because wearable electronics often work while undergoing bending. FIG. 8a shows the characteristics of the drain current versus gate biasing voltage of a f-HVTFT under dynamic bending in the plot 1201, wherein the bending is along the directions parallel and perpendicular to the source and drain contact pads of the f-HVTFT. The plot 1201 illustrates the drain current versus the gate biasing voltage when the f-HVTFT is flat 1202, bent with a radius of 12 mm 1203, and bent with a radius of 10 mm 1204.

Figure 8B:
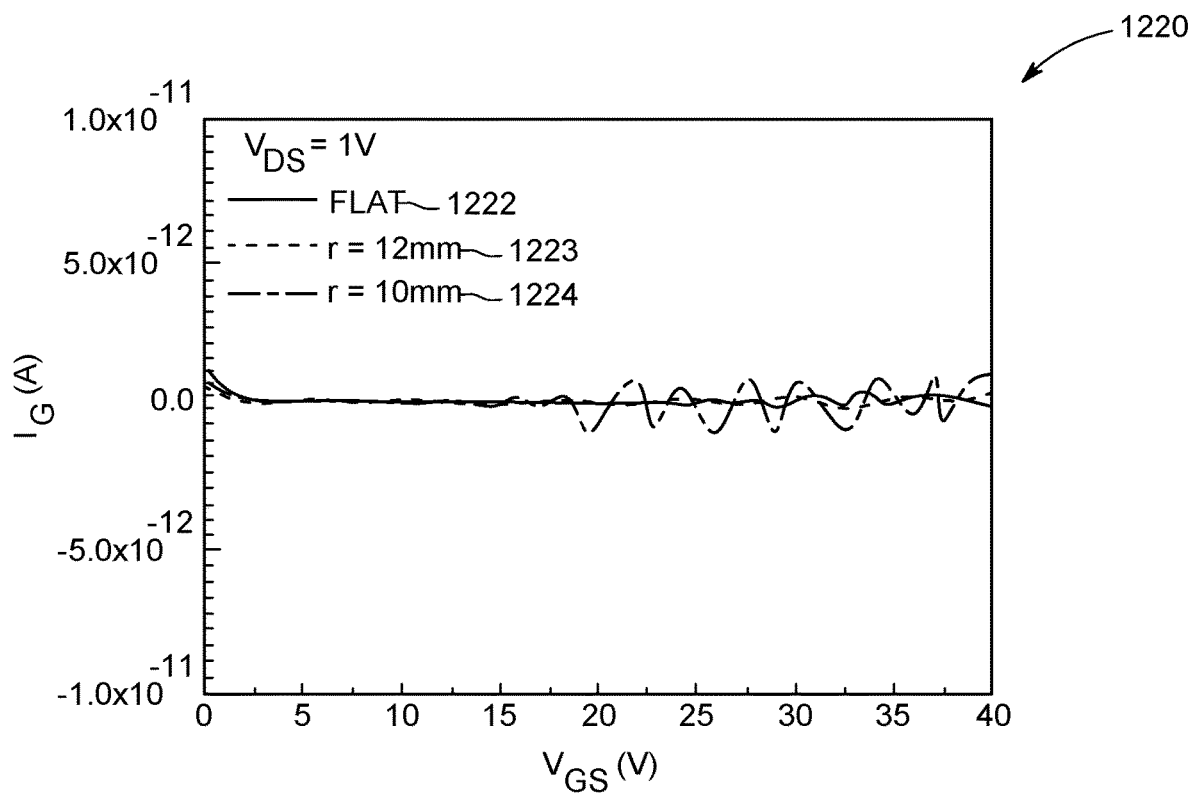
FIG. 8b is a plot showing gate leakage current of a ZnO f-HVTFT according to an embodiment undergoing dynamic bending testing where the bending direction is parallel and perpendicular to the source and drain contact pads.

FIG. 8b shows the characteristics of the gate leakage current versus gate biasing voltage of a f-HVTFT under dynamic bending in the plot 1220, when the bending is along the directions parallel and perpendicular to the source and drain contact pads. The plot 1220 illustrates the gate current when the f-HVTFT is flat 1222, bent with a radius of 12 mm 1223, and bent with a radius of 10 mm 1224.

Figure 8C:
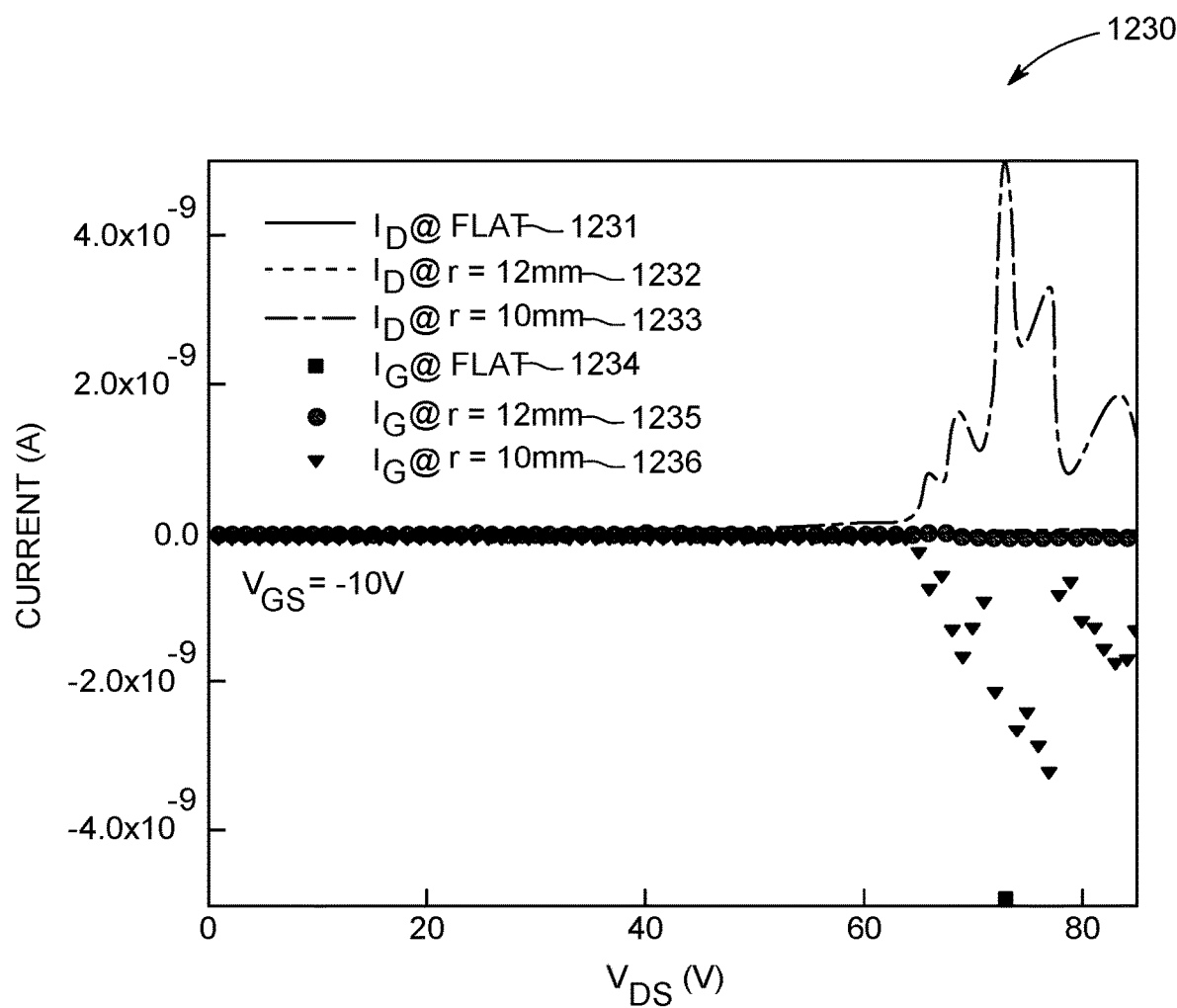
FIG. 8c is a plot showing blocking voltage characteristics of a ZnO f-HVTFT according to an embodiment undergoing dynamic bending testing where the bending direction is parallel and perpendicular to the source and drain contact pads.

FIG. 8c shows the blocking voltage characteristics of a f-HVTFT under dynamic bending in the plot 1230 when the bending is along the directions parallel and perpendicular to the source and drain contact pads. The plot 1230 illustrates the current-voltage characteristics when the f-HVTFT is flat 1231, bent with a radius of 12 mm 1232, and bent with a radius of 10 mm 1233. The plot 1230 also illustrates the current-voltage characteristics when the f-HVTFT is flat 1234, bent with a radius of 12 mm 1235, and bent with a radius of 10 mm 1236.

Both static and dynamic bending tests showed almost identical results for the parallel and perpendicular bending. As shown in FIGS. 8a-c, the transfer characteristics stay unchanged as long as the bending radius is larger than 10 mm. When the bending radius is close to 10 mm, the f-HVTFT starts degrading and showing an increase of subthreshold slope and off-current, reduction of on-current, and a positive shift of threshold voltage. The degradation of on-current may be related to the reduction of the mobility which is affected by the strain field. Deflection of ZnO creates a piezoelectric potential field. For the downward bending, the dielectric-channel interface is stretched, resulting in tensile strain in the interface. This tensile strain creates a positive potential so that the surface potential is raised as described in J. H. He, C. L. Hsin, J. Liu, L. J. Chen, Z. L. Wang, *Adv. Mater.* 2007, 19, 781. As a result, threshold voltage shifts positively, and mobility degrades. On the other hand, it is known that the bending of the device may increase defects near the gate dielectric/channel interface and in the bulk channel as described in Y. Kuo, M. R. Coan, G. Liu, *ECS Trans.*, ECS, 2008, pp. 345-351. These extra defects could also cause the degradation of on-current.

As shown in FIG. 8c, the blocking voltage also shows degradation for the bending radius of 10 mm. The breakdown is related to the significant increase in the gate leakage current. This is likely the result of an increase in the number of cracks in the bulk of the dielectric layer during the bending process. These cracks can form a leakage path for electrons to penetrate through the dielectric layer. As a result, the breakdown occurs at a lower gate bias due to mechanical bending induced gate leakage current. As shown in FIGS. 8a-c, the result of perpendicular bending is also similar to the parallel bending result. Because of the circular electrodes in embodiments, the electrical field distribution in the f-HVTFT is isotropic; therefore, the electrical characteristics of the f-HVTFT are independent on the bending directions. The results of the dynamic bending test are consistent with the static bending test.

The static and dynamic bending tests showed almost identical results for the parallel and perpendicular bending. This is due to the unique features of f-HVTFT embodiments described herein, such as the circular shape and multiple connections, compared to conventional flexible TFT counterparts which are rectangular in shape. Rectangular TFT devices suffer from the non-uniform characteristics resulting from the in-plane anisotropic features while bent along different directions. However, for wearable electronic systems, the bending direction is random. Therefore, the non-uniformity of electrical performance, particularly the variation in blocking voltage at different bending directions could cause system failure. In contrast to the regular TFT devices, embodiments of the circular f-HVTFT described herein provide the same electrical characteristics while bent in any direction. The circular design of the f-HVTFT not only prevents localized electrical field crowding but also enables uniform and stable operation of the f-HVTFT under random bending.

As described herein, embodiments provide a f-HVTFT on flexible, e.g., plastic, substrates fabricated at low temperatures (<110° C.). By employing a circular design, such as the design shown in FIG. 1a, embodiments provide stable and consistent electrical performance even when undergoing bending along random directions. Moreover, the unique design of the f-HVTFT offers high on-current, e.g., 670 μA at $V_{ds}=10$ V (equivalent to the low $R_{on}$ of ~2.40 ohm-cm$^2$), low off-current, e.g., 0.1 pA, and blocking voltage up to 112V. The high blocking voltage and on-current match the output characteristics of the emerging nano-generators of high impedance and the low leakage current ensures low standby power. Embodiments of the f-HVTFT can serve as the critically important but currently missing element, the power controller which transfers energy from the nano-generators to other devices and/or batteries in wearable systems. The integration of the f-HVTFT with nano-generators and other devices on the same flexible substrate/fabric can allow wearable systems to be small in size, lightweight, and also have stable and sustainable operation.

Embodiments of the f-HVTFT described herein are implemented with a center-symmetric circular structure, such as the f-HVTFT 101 depicted in FIG. 1*a*. Unlike conventional rectangular thin film transistors, in the f-HVTFT embodiments described herein, the gate, channel, source, and drain are all circular in shape so that there is no sharp curvature change at the corner. In conventional thin film transistor design, there is a rectangular channel and in such designs, the highest electrical field occurs at the corners of this rectangular channel. This rectangular channel configuration limits the blocking voltage of these conventional devices. The circular design of embodiments avoids the electrical field crowding effect which occurs at the corners of the rectangular channel in conventional TFTs. The uniform electric field in embodiments contributes to embodiments of the f-HVTFTs described herein having enhanced blocking voltage. This high blocking voltage is a result of the f-HVTFT having a more uniform electric field distribution in the channel. The high blocking voltage that embodiments provide is particularly important for high voltage and high power applications. The uniform electric field in embodiments also eliminates the weak point of the device breakdown at high drain bias.

The symmetric design of embodiments also provides increased device reliability. Wearable systems are subject to external forces that generate bending along arbitrary directions. Unlike existing thin film transistors, which are subject to failure because of this bending, embodiments of the present invention prevent mechanical and electrical failures caused by the bending by utilizing the unique circular electrodes that have multiple connections to their respective structures, e.g., source and gate. For example, an embodiment may use multiple connections between the gate structure and gate electrode to provide redundancy for the connection. Thus, embodiments have improved reliability and life-span. This is particularly advantageous when the f-HVTFTs described herein are incorporated into devices subject to bending.

As described hereinabove, embodiments of the present invention, e.g., the f-HVTFT 101, include electrode connection pads, e.g., 102*b* and 105*b*, that have multiple connections to their respective structures, e.g., the source 102*a* and the gate 105*a*. According to an embodiment, the multiple connections may be equally distributed in perpendicular directions. Such connections are depicted in FIGS. 1*a* and 1*b* which illustrate multiple connections between the source electrode pad 102*b* and the source 102*a*, and between the gate electrode pad 105*b* and the gate 105*a*. According to an embodiment, these connections are equally distributed along the circumference in perpendicular directions to further enhance the strength of the f-HVTFT against bending from arbitrary directions.

By using transparent conductive oxide materials (such as GZO, AZO, etc.) for electrodes of the source, drain and gate, the entire f-HVTFT can be made transparent, which is needed for transparent wearable systems. The f-HVTFTs, according to embodiments of the present invention, can be transparent so as to not affect the aesthetic of the devices in which they are incorporated. Transparent wearable electronics are advantageous because they have an attractive exterior and cause the least interference to the appearance of wearable products. Fashion plays an important role in wearable systems and often, wearable systems must be aesthetically pleasing. The currently existing silicon-based technologies are generally opaque and thus, it is difficult to design aesthetically desirable wearable electronics using the existing opaque transistors.

Further, because embodiments provide f-HVTFTs that are transparent, flexible, or both, the f-HVTFTs described herein are more comfortable for users when incorporated into wearable devices. Conventional power management systems are bulky and opaque which degrades the overall appearance and user experience. Moreover, the rigid substrates used by conventional devices introduce foreign body sensations. These issues cause an uncomfortable user experience. Because f-HVTFTs according to the embodiments described herein are transparent and flexible, embodiments of the f-HVTFT are more suitable for use in wearables and are more imperceptible in terms of vision and touch to users.

Embodiments of the present invention can be fabricated using a low temperature process as compared to existing transistors. Existing high voltage transistors used in the high voltage inverters require high temperature processes for fabrication. This is especially true for devices made using wide band gap semiconductors, such as silicon carbide (SiC) and gallium nitride (GaN). These high temperature processes are unsuitable for creating flexible power management devices, such as the embodiments of the f-HVTFT described herein. Further, low temperature processes which can used to build the f-HVTFTs described herein, can be used in the back end of line (BEOL) process of integrated circuit fabrication.

Embodiments provide green and lower cost oxide semiconductor-based high voltage devices for the power management components used in self-powered wearable systems because the materials used in embodiments of the f-HVTFT described herein are indium free. The existing IGZO high voltage thin film transistors operate above 100 V with an on/off current ratio of $10^7$. However, IGZO devices are not suitable for wearable systems because of: (i) the high cost of indium, particularly for large-area electronic systems and wearable systems; (ii) environmental pollution caused by the toxicity of high indium concentration in the IGZO, especially during manufacturing and disposal; and (iii) toxicity of high indium concentration in IGZO devices creates a safety concern for applications in human-worn wearable systems.

The f-HVTFTs described herein are significantly cheaper to produce than existing high voltage devices. Conventional high voltage devices rely on expensive substrates and manufacturing processes. For example, many traditional high voltage devices are fabricated using ion implantation and epitaxial growth. In comparison, the f-HVTFTs described herein can be fabricated using low cost materials and processing technologies, and thus, are suitable for mass production. Moreover, the low cost and low temperature processes allow for the f-HVTFTs described herein to be made on a variety of different substrates, such as plastic and polyimide substrates.

The center-symmetric circular structure and the multiple connection electrode pads used in embodiments are also beneficial because wearable devices are subject to external forces that can generate bending along arbitrary directions. Conventional TFT designs with rectangular configurations are anisotropic, thus are susceptible to failure under bending along certain directions. In contrast, the design of the f-HVTFT described herein combines a center-symmetrical structure with multiple connection electrode pads; therefore, is not susceptible to bending in any particular direction and minimize the mechanical and electrical failures caused by such bending. The design of embodiments improves electrical uniformity in the f-HVTFT while being subjected to bending from random directions.

Moreover, embodiments may use high dielectric constant materials such as $Al_2O_3$ as the gate dielectric layer instead of $SiO_2$, which improves performance to provide the desired blocking voltage and on current values.

Embodiments utilize a unique combination of materials to provide several advantages compared to existing devices. One such example embodiment utilizes a MZO, high-k dielectric, and a flexible substrate which is a unique and novel transistor material combination. Such a material composition is advantageous because it is: (i) highly reliable and stable compared to other oxides, (ii) bio-compatible, which is particularly advantageous for human wearable systems, (iii) provides a good combination of mechanical bending strength and electrical characteristics, (iv) environmentally friendly, and (v) low cost.

The ZnO and MZO based f-HVTFT embodiments with symmetric design and unique materials, as described herein, provide high blocking voltage 100 V) and sufficient on-current ($\approx$10 μA). Thus, embodiments provide a novel device that satisfies the output characteristics of different energy sources, such as high impedance wearable triboelectric nanogenerators and wearable solar cells. Further, the small leakage current of embodiments provides low stand-by power which is desirable for wearable system applications. Moreover, the flexible high voltage thin film transistors described herein, with a symmetric ring structure and electrodes, provides improved reliability against directional bending and makes it possible to provide a lightweight, integrated, and wearable power management system. By integrating the power management system with multiple wearable energy sources, applications employing embodiments provide more stable power without requiring external connections. This enables stable and sustainable operation of wearable and portable systems.

The advantages provided by embodiments of the present invention are not available from existing flexible thin film transistors. Existing devices are limited to low voltage applications such as OLED displays. Further, many existing flexible thin film transistors are often fabricated with toxic and costly materials such as InGaZnO (IGZO). Moreover, embodiments may utilize materials such as MZO and ZnO, which is more reliable, cheaper, and easier to make and fabricate compared to existing materials, such as single walled carbon nanotubes (SWCNT). For instance, ZnO can be processed at a low temperature. Further, the MZO and ZnO transistor embodiments described herein have improved performance, including a wider bandgap, one-order higher mobility and at least four orders of magnitude higher on/off ratio than SWCNT based flexible thin film transistors. Moreover, many energy harvesters, i.e., nano-generators, are based on ZnO materials. Thus, integrating the power system implemented using a ZnO based f-HVTFT, according to an embodiment, with the nano-generators of self-powered wearable devices, is much easier if the nano-generator and power management circuits are composed of the same materials, e.g., ZnO. Likewise, in one embodiment, the f-HVTFT uses MZO to replace the pure ZnO as the channel layer. In contrast to the existing thin film transistors using pure ZnO, the MZO-based f-HVTFT according to an embodiment offers more stable operation, including better thermal, threshold, and NBS stability.

As described herein, embodiments can be used in wearable devices for power management. Currently, there has been essentially no flexible power management device such as the embodiments of the present invention. Likewise, there has been no such f-HVTFT integrated and used in inverters and converters used in self-powered wearable systems.

An embodiment of the f-HVTFT shows a blocking voltage of 112V, on-current of 100 μA and off-current of 0.1 pA. The recoverable bending radius of embodiments of the f-HVTFT is ~12 mm, and the blocking voltage is maintained while the device is under bending. Embodiments of the f-HVTFT described herein with the highly center-symmetric ring structure demonstrate that the electrical characteristics and blocking voltage are identical under the bending along different directions. These characteristics make embodiments a promising candidate to be used for power management of self-powered wearable electronic systems.

Embodiments of the present invention, such as the f-HVTFT 101 of FIG. 1*a* have a variety of uses across multiple industries. Embodiments may be utilized in self-powered wearable systems. Further, f-HVTFTs according to embodiments, can be used to provide flexible inverters. For instance, a f-HVTFT according to an embodiment, such as the f-HVTFTs 101 and 551, can be used to build an inverter circuit which can be used to drive high voltage devices such as MEMS devices and actuators. Likewise, a flexible inverter implemented using a f-HVTFT described herein can be used for energy conversion in a flexible solar cell. Embodiments of the f-HVTFT may be included in portable and wearable systems to provide blocking voltage and on-current matching output characteristics of a nano-generator coupled to the wearable system. Moreover, the f-HVTFTs described herein can be employed in high voltage three-dimensional vertically integrated circuits to reduce the overall size of the integrated circuits. The f-HVTFTs described herein are also easily integrated with other flexible electronic devices and are used in mobile systems, and displays.

Existing flexible thin film transistor technology, unlike embodiments, does not provide sufficient output for high voltage, e.g., 100 V, applications. Thus, unlike existing devices, a f-HVTFT according to an embodiment, can be used in applications for power management in self-powered wearable systems. Power management for self-powered wearable devices requires approximately 100 V, and simply, existing flexible thin film transistors cannot provide such a voltage. These existing flexible thin film transistors are limited to applications involving regular electronic devices operated under low power and low voltage.

Figure 9A:
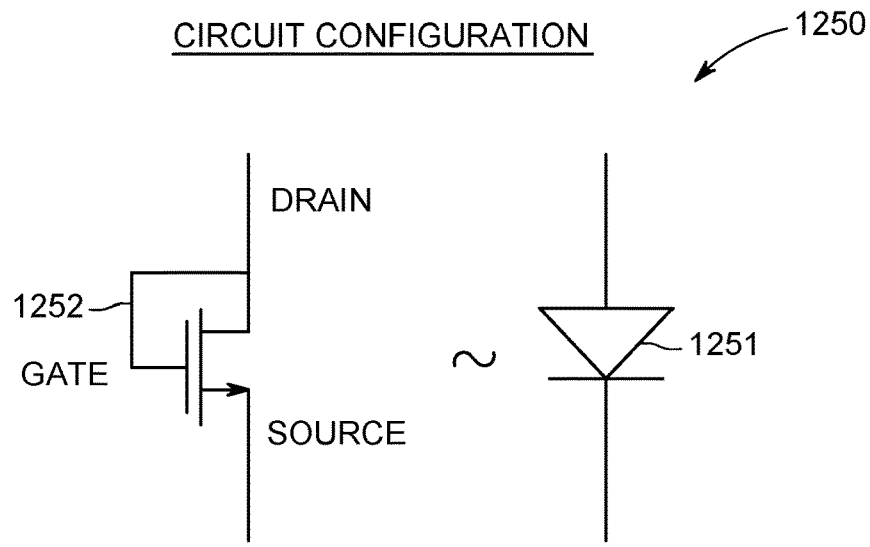
FIG. 9a is a schematic diagram illustrating a circuit configuration of a flexible diode converted from a f-HVTFT.

Further, embodiments of the f-HVTFT described herein can be configured and implemented to provide a flexible diode. FIG. 9*a* is a schematic diagram illustrating a circuit configuration 1250, in which a f-HVTFT 1252 is converted into a flexible diode 1251 by reconfiguring and re-connecting specific terminals. For example, in an embodiment, by connecting the drain terminal with the gate terminal the f-HVTFT 1252 can operate as a flexible diode 1251.

Figure 9B:
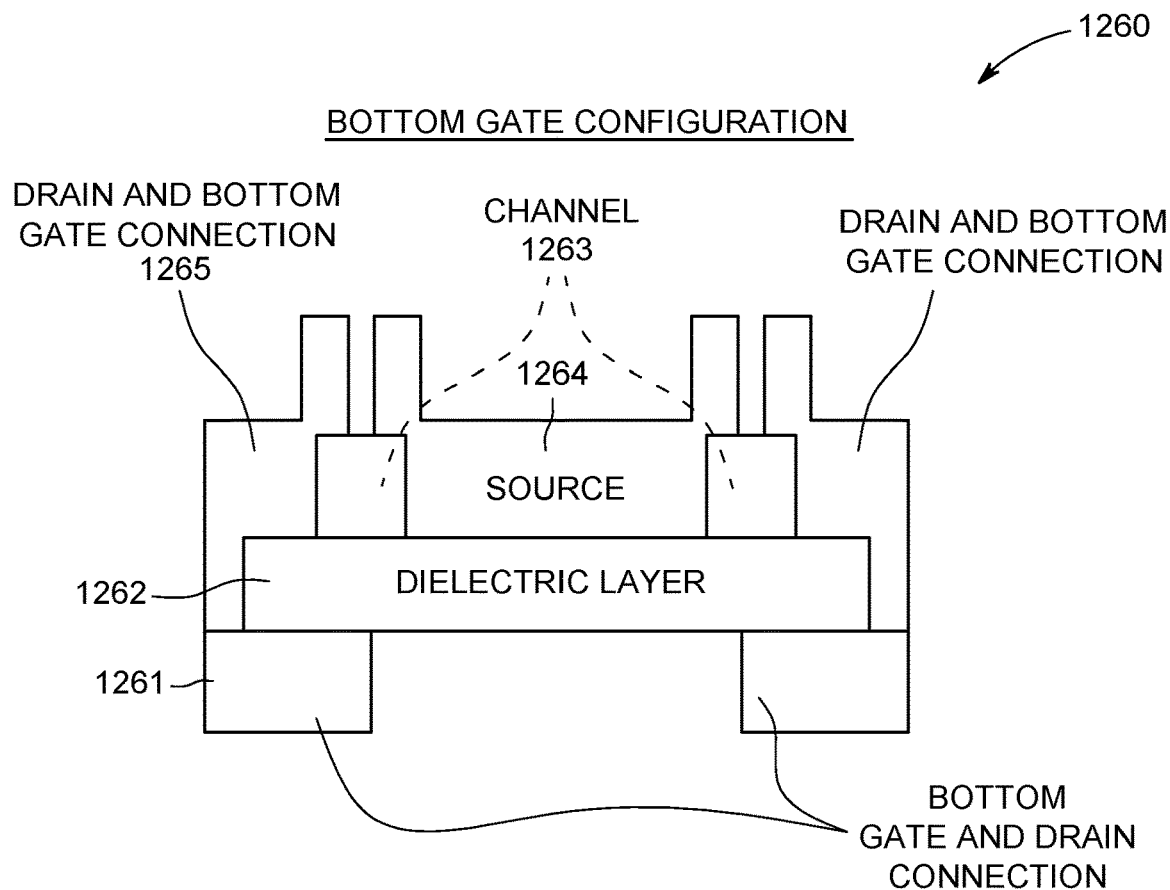
FIG. 9b is a schematic diagram illustrating a cross section of a f-HVTFT, having a bottom gate configuration, converted to operate as a flexible diode.

FIG. 9b is a schematic diagram illustrating a cross section of a flexible diode (f-diode) 1260 which is converted from a f-HVTFT with a bottom gate configuration. To convert the f-HVTFT 101 into the f-diode 1260, the source and drain in the original center-symmetric f-HVTFT 101 is exchanged to make the easy electrical connection: the source 1264 is the circular pattern while the drain 1265 is the ring-structure, and the ring-shaped gate 1261 and the ring-shaped drain 1265 are electrically connected in the fabrication process. While not depicted in FIG. 9b, the f-HVTFT converted to a flexible diode 1260, also includes a drain electrode pad having multiple connections to the ring-shaped drain 1265 and a gate electrode pad having multiple connections to the ring-shaped gate 1261.

Figure 9C:
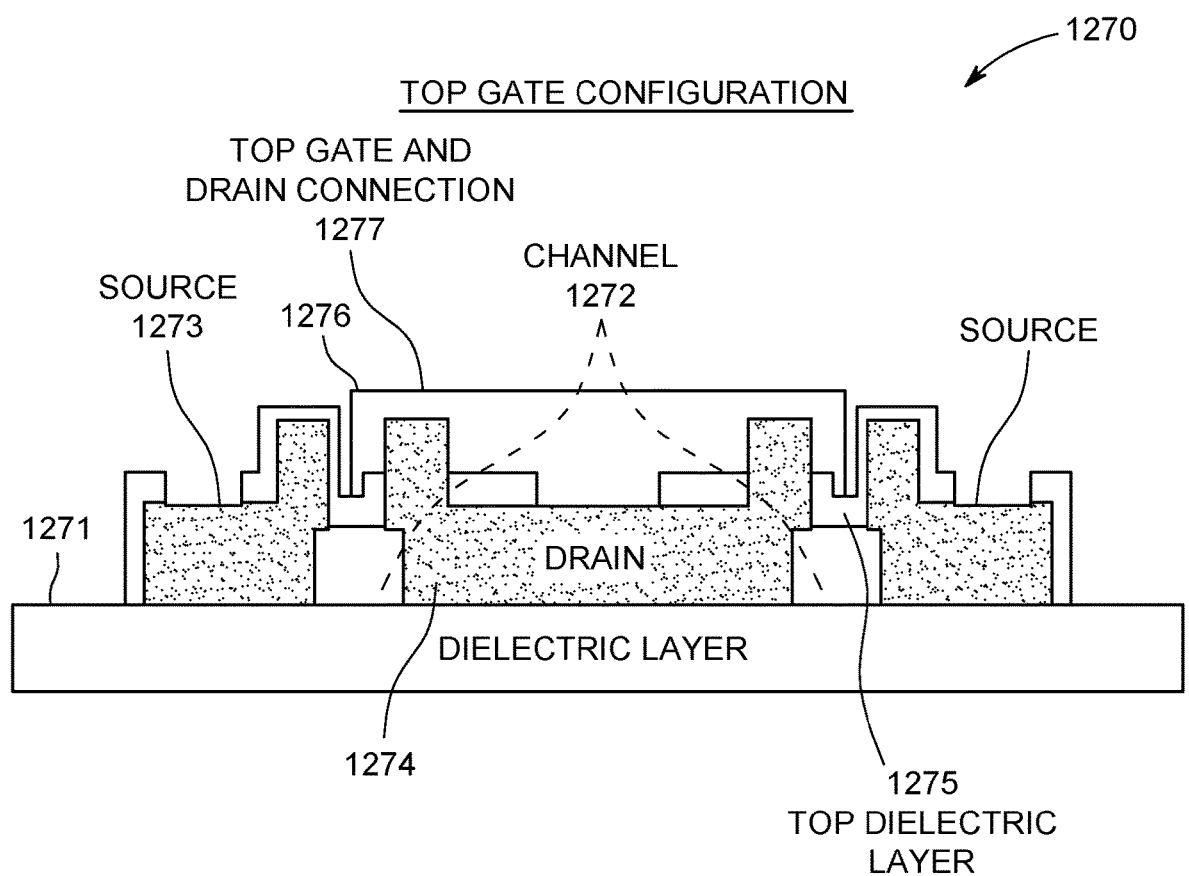
FIG. 9c is a schematic diagram illustrating a cross section of a f-HVTFT, having a top gate configuration, converted to operate as a flexible diode.

FIG. 9c is a schematic diagram illustrating a cross section of a flexible diode 1270, which is converted from a f-HVTFT with a top gate configuration, e.g., the f-HVTFT 551. To convert the f-HVTFT 551 into f-diode 1270, the ring-shaped top gate 1276 is electrically connected with the circular drain 1274 through the metallization pattern 1277 formed during the fabrication process. While not depicted in FIG. 9c, the f-HVTFT with top gate converted to a f-diode 1270, also includes a source electrode pad (not shown) having multiple connections to the ring-shaped source 1273 and a gate electrode pad (not shown) having multiple connections to the ring-shaped gate 1276.

Figure 10:
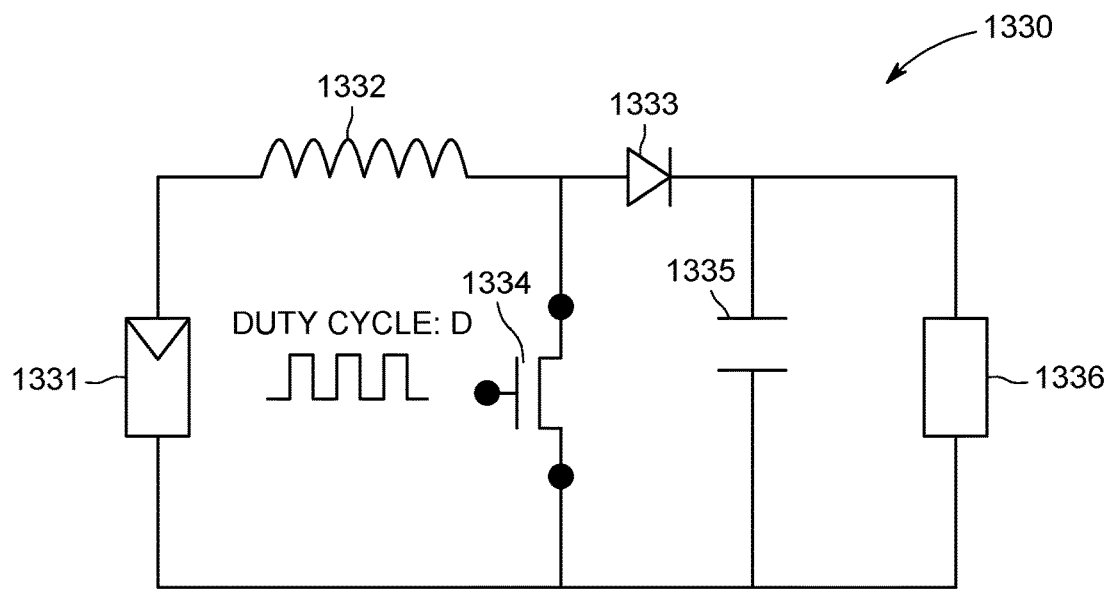
FIG. 10 is a schematic circuit diagram of a DC/DC converter implemented using a f-HVTFT embodiment.

Embodiments of the f-HVTFT may be employed to provide a DC/DC converter. FIG. 10 is a schematic circuit diagram 1330 of a transformerless DC/DC converter implemented using a f-HVTFT embodiment. The circuit 1330 includes the pv module 1331, inductor 1332, diode 1333 (which may be a flexible diode as described herein), f-HVTFT 1334, capacitor 1335, and load 1336. In the DC/DC converter, the f-HVTFT 1334 may be any embodiments of the f-HVTFT described herein, e.g., the bottom-gated f-HVTFT 101 or the top-gated f-HVTFT 551, amongst others. Moreover, the diode 1333 may be the flexible diode which is formed from a top or bottom gate f-HVTFT as described hereinabove in relation to FIGS. 9b and 9c. For the DC/DC converter, the diode 1333 separates input and output of the DC/DC converter circuit 1330. The diode 1333 blocks the same high voltage as embodiments of the f-HVTFT described herein.

Figure 11:
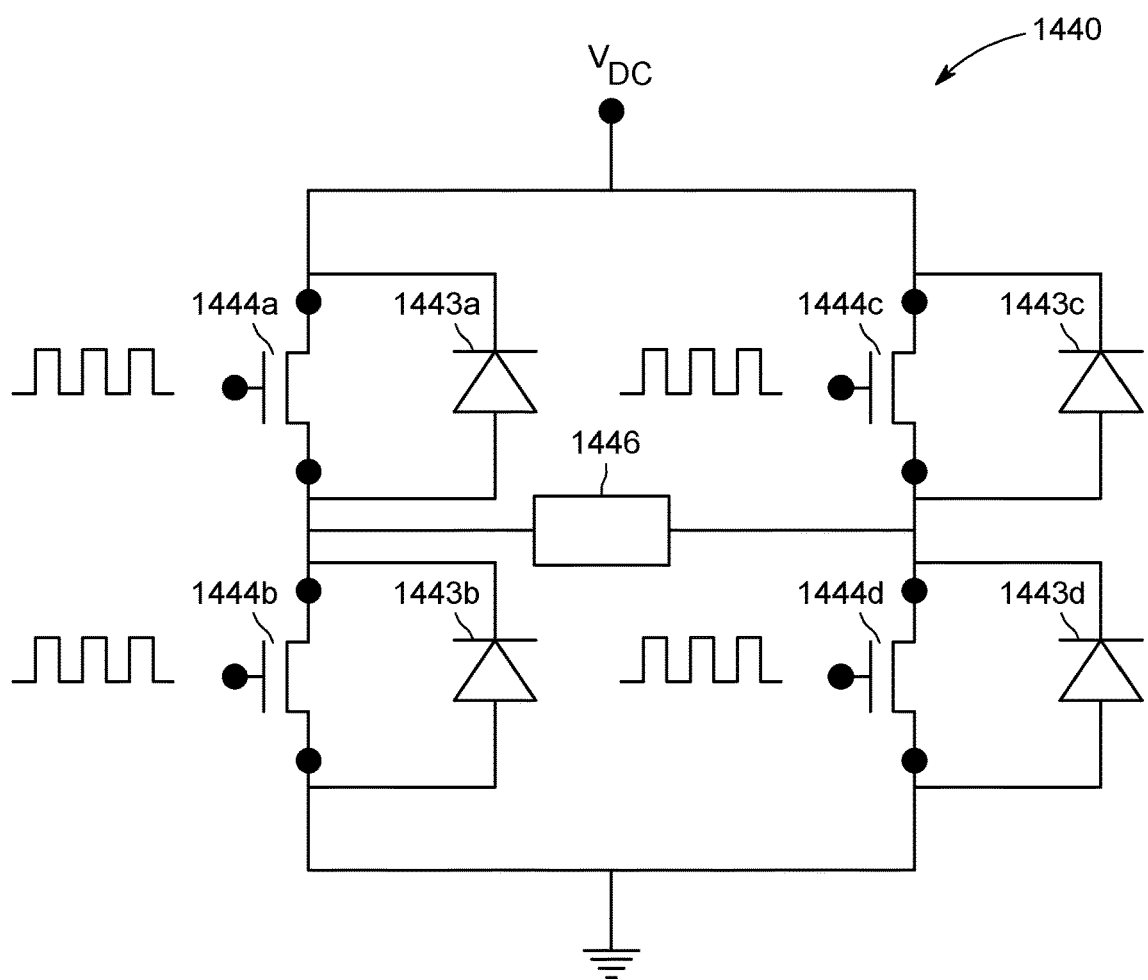
FIG. 11 is a schematic circuit diagram of a DC/AC inverter implemented using a f-HVTFT embodiment.

Further, embodiments of the f-HVTFT may be employed to provide a DC/AC inverter. FIG. 11 is a schematic circuit diagram of a full bridge DC/AC inverter 1440 implemented using f-HVTFT embodiments described herein. The circuit 1440 includes the f-HVTFTs 1444a-d, the diodes 1443a-d (which may be flexible diodes as described herein) and the load 1446. In the DC/AC inverter, the f-HVTFTs 1444a-d may be any embodiments of the f-HVTFT described herein, e.g., the bottom-gated f-HVTFT 101 or the top-gated f-HVTFT 551, amongst others. Moreover, the diodes 1443a-d may be flexible diodes formed from a bottom gate f-HVTFT 101 or top gate f-HVTFT 551 as described hereinabove in relation to FIGS. 9b and 9c. In the DC/AC inverter, in the respective f-HVTFT/diode pairings, e.g., f-HVTFT 1444a and diode 1443a, the f-HVTFT and diode are connected in parallel.

In both the DC/DC converter 1330 and DC/AC inverter 1440, the diodes block high voltage in the reverse bias condition. According to an embodiment, the DC/DC converter 1330 and the DC/AC inverter 1440 may be used in the power management components for self-powered wearable systems. Further, while FIGS. 10 and 11 depict particular circuits 1330 and 1440, embodiments are not limited to these example circuit configurations and the f-HVTFT and flexible diode embodiments described herein may be implemented in a variety of circuit configurations.

The teachings of all patents, published applications and references cited herein are incorporated by reference in their entirety.

While example embodiments have been particularly shown and described, it will be understood by those skilled in the art that various changes in form and details may be made therein without departing from the scope of the embodiments encompassed by the appended claims.

What is claimed is:

1. A center-symmetric flexible high voltage thin film transistor (f-HVTFT) having a bottom gate configuration, the f-HVTFT comprising:
   a flexible substrate;
   a ring-shaped gate on the flexible substrate;
   an insulating gate dielectric layer on the gate and the flexible substrate;
   a ring-shaped semiconductor channel on the insulating gate dielectric layer;
   a ring-shaped source and a circular drain on the ring-shaped semiconductor channel and with electrical contact to the ring-shaped semiconductor channel, wherein the source, the drain, and the gate are concentric and the source and the drain are over the insulating gate dielectric layer, and where, there is an offset region between the circular drain and the ring-shaped gate; and
   a ring-shaped source electrode pad having multiple connections from an inner circumference of the ring-shaped source electrode pad to the ring-shaped source, and a ring-shaped gate electrode pad having multiple connections from an inner circumference of the ring-shaped gate electrode pad to the ring-shaped gate.

2. The f-HVTFT of claim 1 wherein the flexible substrate is transparent.

3. The f-HVTFT of claim 1 wherein the flexible substrate is opaque.

4. The f-HVTFT of claim 1 wherein a given electrode pad has multiple connections, equally distributed in perpendicular directions, to the gate or the source.

5. The f-HVTFT of claim 1 wherein the flexible substrate is composed of at least one of: polyimide, plastics, polyethylene naphthalate (PEN), bendable glass, paper and textiles.

6. The f-HVTFT of claim 1 wherein the channel is composed of at least one oxide semiconductor.

7. The f-HVTFT of claim 6 wherein the oxide semiconductor channel is composed of at least one of: Zinc Oxide (ZnO), pure ZnO, doped ZnO, ZnO based semiconductor heterostructures, and ZnO alloys.

8. The f-HVTFT of claim 6 wherein the oxide semiconductor channel is composed of Magnesium Zinc Oxide ($Mg_xZn_{1-x}O$) where $0<x<0.06$.

9. The f-HVTFT of claim 1 wherein the insulating gate dielectric layer is a single layer composed of one of: Silicon Dioxide ($SiO_2$), Aluminum Oxide ($Al_2O_3$), Hafnium Oxide ($HfO_2$), and Magnesium Oxide (MgO).

10. The f-HVTFT of claim 1 wherein the insulating gate dielectric layer is a multi-layer dielectric stacking structure composed of at least one of: $SiO_2$, $Al_2O_3$, $HfO_2$, and MgO.

11. The f-HVTFT of claim 1 wherein the f-HVTFT is fabricated at temperatures compatible with the flexible substrate.

12. A flexible diode comprising:
    a flexible substrate;
    a ring-shaped gate on the flexible substrate;

an insulating gate dielectric layer on the gate and the flexible substrate;

a ring-shaped oxide semiconductor channel on the insulating gate dielectric layer;

a circular source and a ring-shaped drain on the ring-shaped oxide semiconductor channel and with electrical contact to the ring-shaped oxide semiconductor channel, wherein the source, the drain, and the gate are concentric and the source and the drain are over the insulating gate dielectric layer, and where, there is an offset region between the circular source and the ring-shaped gate and a terminal of the ring-shaped drain is connected to a terminal of the ring-shaped gate; and a drain electrode pad having multiple connections to the ring-shaped drain and a gate electrode pad having multiple connections to the ring-shaped gate.

13. The flexible diode of claim 12 wherein the flexible substrate is transparent or opaque.

14. The flexible diode of claim 12 wherein a given electrode pad has multiple connections, equally distributed in perpendicular directions, to the drain or the gate.

15. The flexible diode of claim 12 wherein the flexible substrate is composed of at least one of: polyimide, plastics, polyethylene naphthalate (PEN), bendable glass, paper and textiles.

16. The flexible diode of claim 12 wherein the oxide semiconductor channel is composed of at least one of: Zinc Oxide (ZnO), pure ZnO, doped ZnO, ZnO based semiconductor heterostructures, and ZnO alloys.

17. The flexible diode of claim 12 wherein the insulating gate dielectric layer is a single layer composed of one of: Silicon Dioxide ($SiO_2$), Aluminum Oxide ($Al_2O_3$), Hafnium Oxide ($HfO_2$), and Magnesium Oxide (MgO).

18. The flexible diode of claim 12 wherein the insulating gate dielectric layer is a multi-layer dielectric stacking structure composed of at least one of: $SiO_2$, $Al_2O_3$, $HfO_2$, and MgO.

19. The flexible diode of claim 12, wherein the oxide semiconductor channel is composed of Magnesium Zinc Oxide ($Mg_xZn_{1-x}O$) where $0<x<0.06$.

20. A transformer-less DC/DC converter implemented in a power management component of a self-powered wearable system, the DC/DC converter comprising:

a flexible high voltage thin film transistor (f-HVTFT), the f-HVTFT comprising:

a flexible substrate;

a ring-shaped gate on the flexible substrate;

an insulating gate dielectric layer on the gate and the flexible substrate;

a ring-shaped oxide semiconductor channel on the insulating gate dielectric layer;

a ring-shaped source and a circular drain on the ring-shaped oxide semiconductor channel and with electrical contact to the ring-shaped oxide semiconductor channel, wherein the source, the drain, and the gate are concentric and the source and the drain are over the insulating gate dielectric layer, and where, there is an offset region between the circular drain and the ring-shaped gate; and a source electrode pad having multiple connections to the ring-shaped source and a gate electrode pad having multiple connections to the ring-shaped gate;

a flexible diode, the flexible diode comprising:

a given flexible substrate;

a given ring-shaped gate on the given flexible substrate;

a given insulating gate dielectric layer on the given gate and the given flexible substrate;

a given ring-shaped oxide semiconductor channel on the given insulating gate dielectric layer;

a given circular source and a given ring-shaped drain on the given ring-shaped oxide semiconductor channel and with electrical contact to the given ring-shaped oxide semiconductor channel, wherein the given source, the given drain, and the given gate are concentric and the given source and the given drain are over the given insulating gate dielectric layer, and where, there is a given offset region between the given circular source and the given ring-shaped gate and a terminal of the given ring-shaped drain is connected to a terminal of the given ring-shaped gate; and a given drain electrode pad having multiple connections to the given ring-shaped drain and a given gate electrode pad having multiple connections to the given ring-shaped gate.

21. The DC/DC converter of claim 20 wherein the flexible diode separates input and output of the DC/DC converter.

\* \* \* \* \*